(12) United States Patent
Morioka et al.

(10) Patent No.: US 11,507,229 B2
(45) Date of Patent: Nov. 22, 2022

(54) MOLDED BODY FOR ELECTRONIC FUNCTION, METHOD FOR MANUFACTURING THE SAME, AND OPERATION DEVICE USING MOLDED BODY FOR ELECTRONIC FUNCTION

(71) Applicant: Panasonic Intellectual Property Management Co., Ltd., Osaka (JP)

(72) Inventors: Hiroshi Morioka, Osaka (JP); Takashi Morimoto, Osaka (JP); Hideaki Eto, Osaka (JP); Tomoya Moriura, Osaka (JP); Wahei Agemizu, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 86 days.

(21) Appl. No.: 17/098,901

(22) Filed: Nov. 16, 2020

(65) Prior Publication Data

US 2021/0157427 A1    May 27, 2021

(30) Foreign Application Priority Data

Nov. 21, 2019 (JP) ............................. JP2019-210677

(51) Int. Cl.

| | |
|---|---|
| *G06F 3/044* | (2006.01) |
| *H01L 25/075* | (2006.01) |
| *H01L 33/60* | (2010.01) |
| *H01L 33/48* | (2010.01) |
| *H01L 33/62* | (2010.01) |
| *H01L 33/56* | (2010.01) |
| *B29C 45/16* | (2006.01) |
| *B29C 45/14* | (2006.01) |
| *B29L 31/34* | (2006.01) |

(52) U.S. Cl.
CPC ........ *G06F 3/044* (2013.01); *B29C 45/14336* (2013.01); *B29C 45/1671* (2013.01); *H01L 25/0753* (2013.01); *H01L 33/483* (2013.01); *H01L 33/60* (2013.01); *B29L 2031/3475* (2013.01); *H01L 33/56* (2013.01); *H01L 33/62* (2013.01); *H01L 2933/005* (2013.01)

(58) Field of Classification Search
None
See application file for complete search history.

(56) References Cited

U.S. PATENT DOCUMENTS

| | | | |
|---|---|---|---|
| 2018/0018051 A1* | 1/2018 | Ogura | .................. G02F 1/1343 |
| 2020/0343770 A1* | 10/2020 | Baker | ..................... H02J 50/12 |

FOREIGN PATENT DOCUMENTS

| | | |
|---|---|---|
| JP | 4969424 B | 7/2012 |
| JP | 2015-191924 | 11/2015 |
| JP | 2016-036498 | 3/2016 |
| JP | 2019-072916 | 5/2019 |

* cited by examiner

*Primary Examiner* — Stephen T. Reed
(74) *Attorney, Agent, or Firm* — Wenderoth, Lind & Ponack, L.L.P.

(57) ABSTRACT

A molded body for an electronic function includes a first film in which one surface thereof constitutes an external appearance surface, a second film in which an electronic component is mounted on a surface thereof facing a surface of the first film opposite to the external appearance surface, and a first resin that fills a space between the first film and the second film. The first resin has a cavity, and the cavity is filled with a second resin, and the electronic component is disposed in the cavity and surrounded by the second resin.

17 Claims, 19 Drawing Sheets

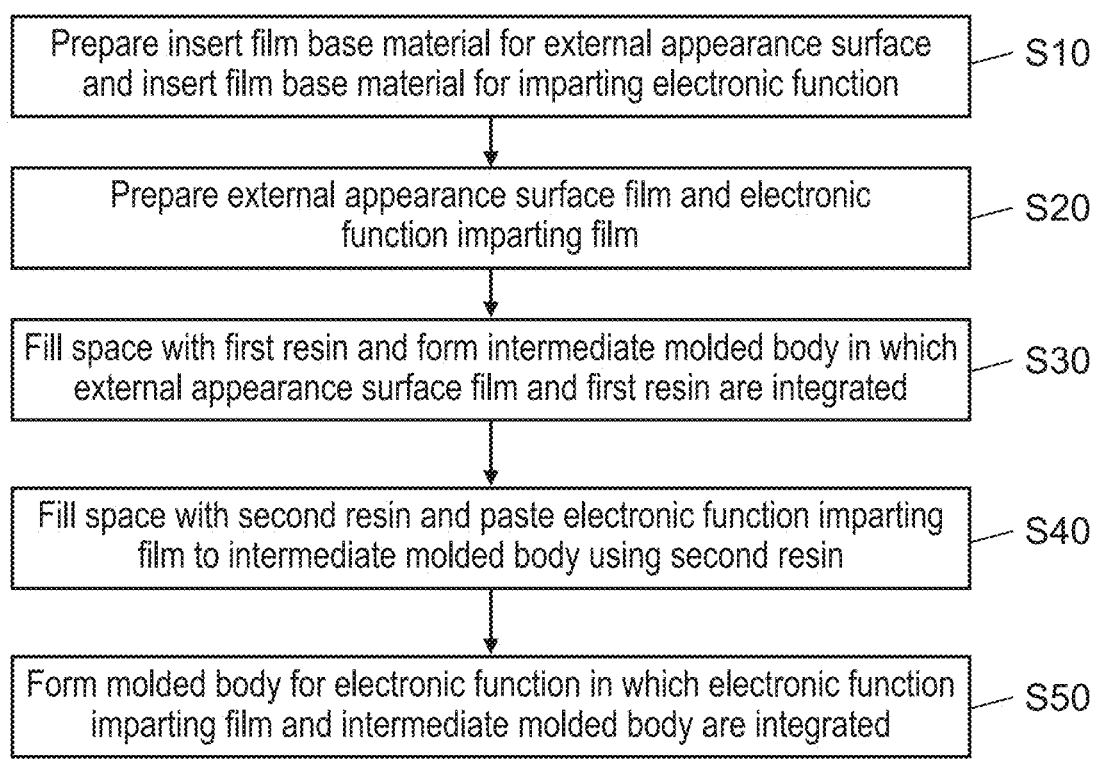

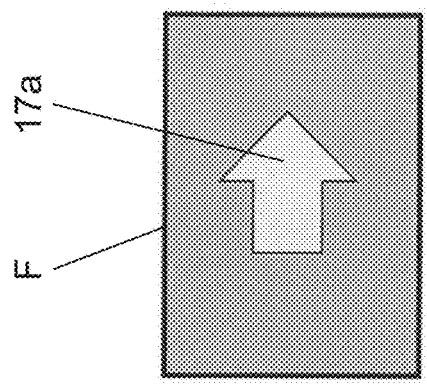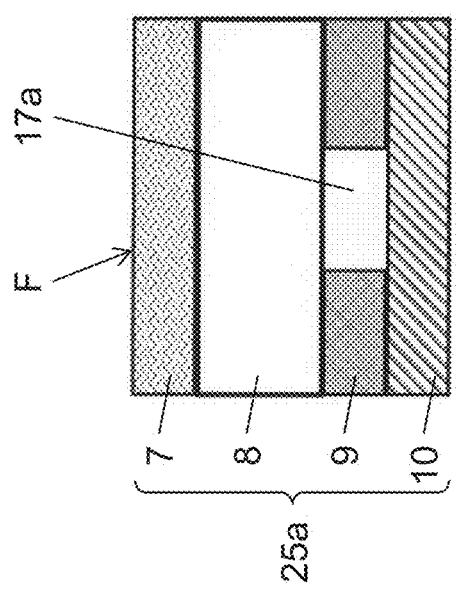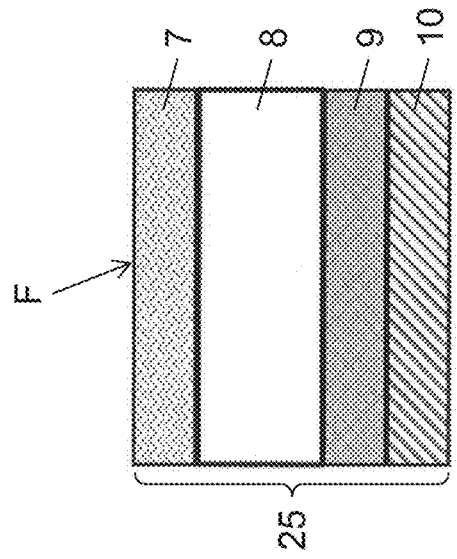

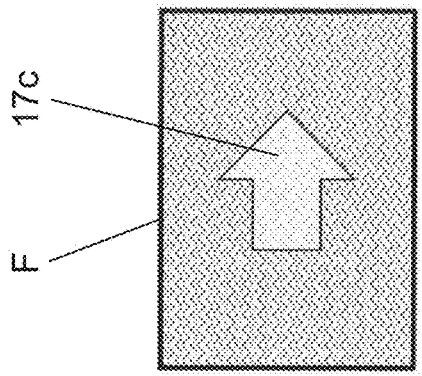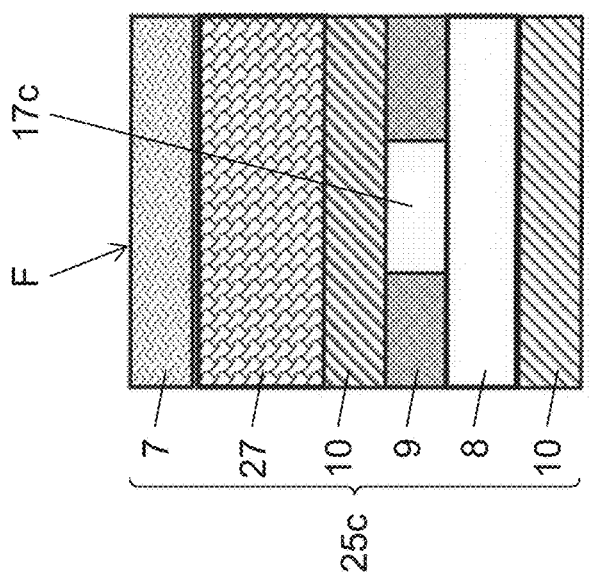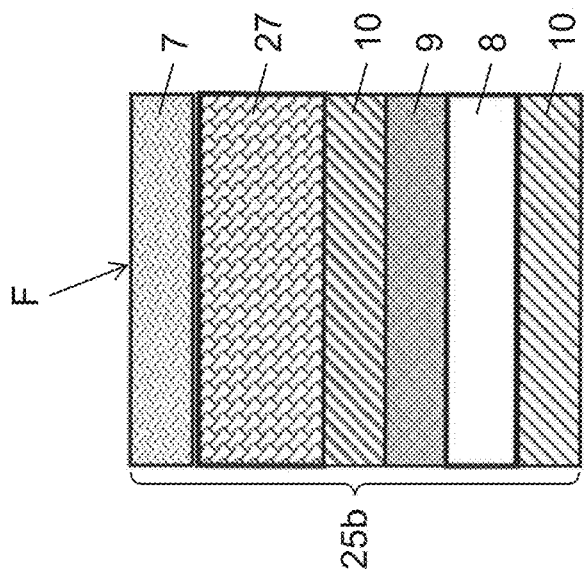

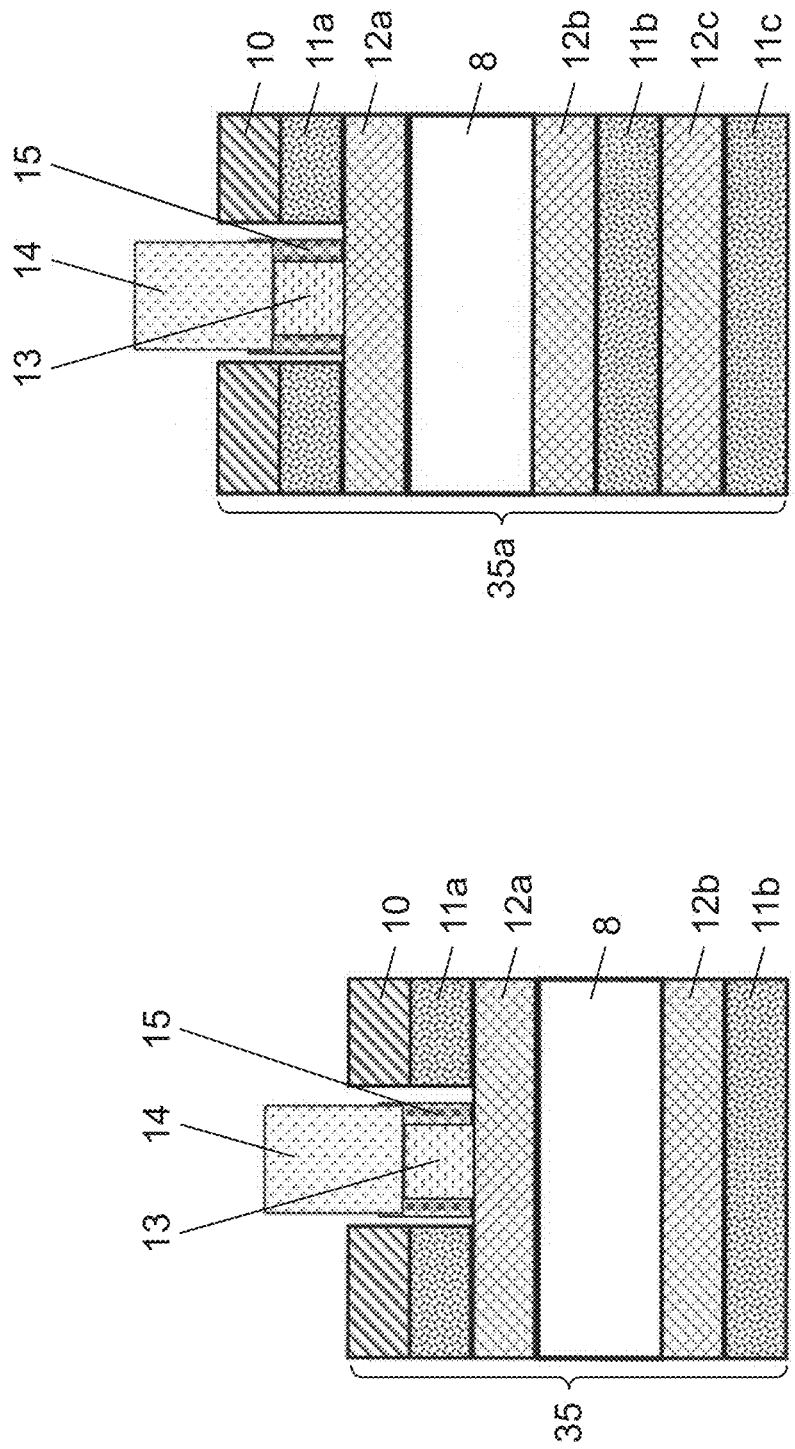

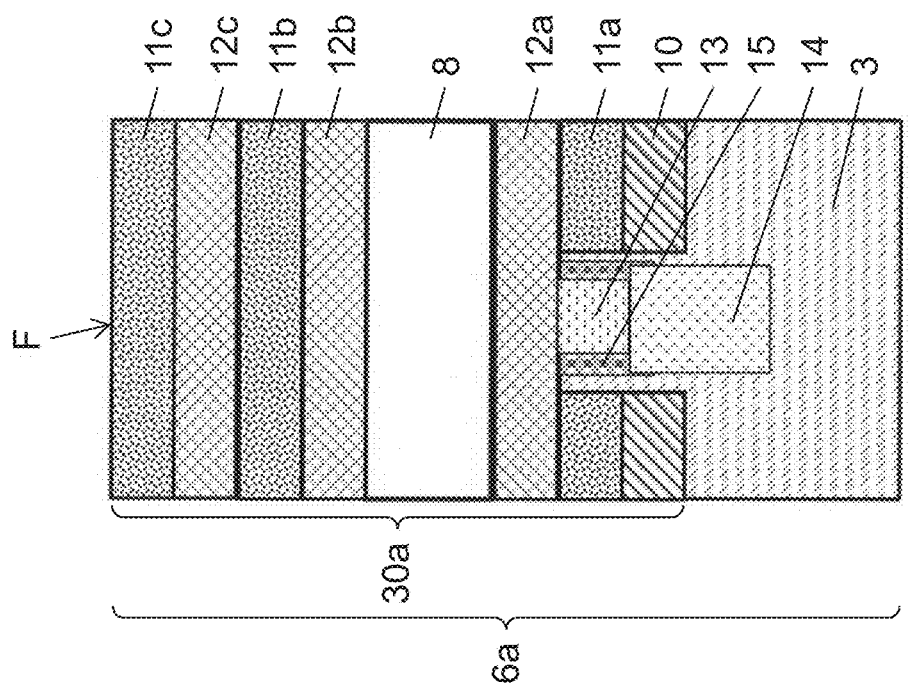
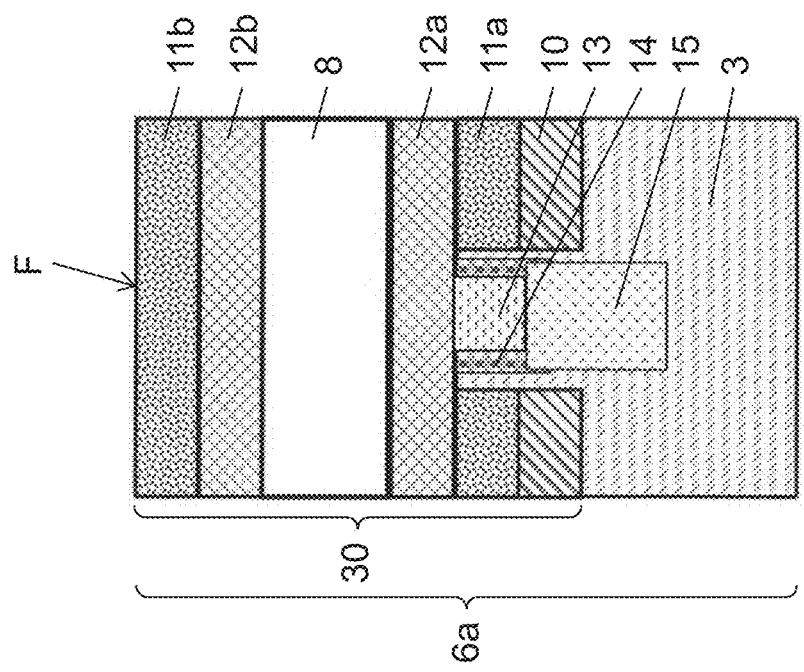

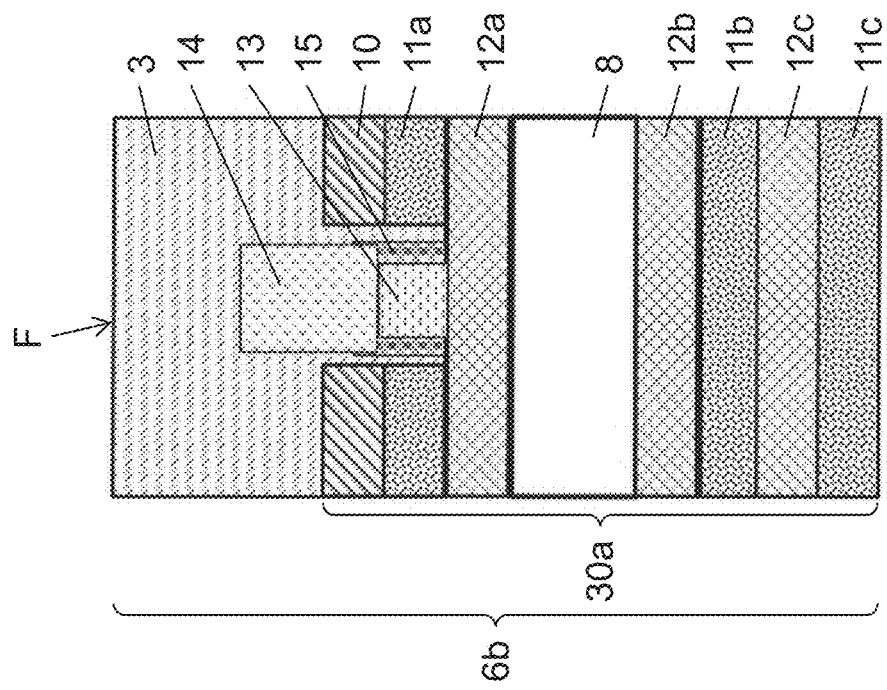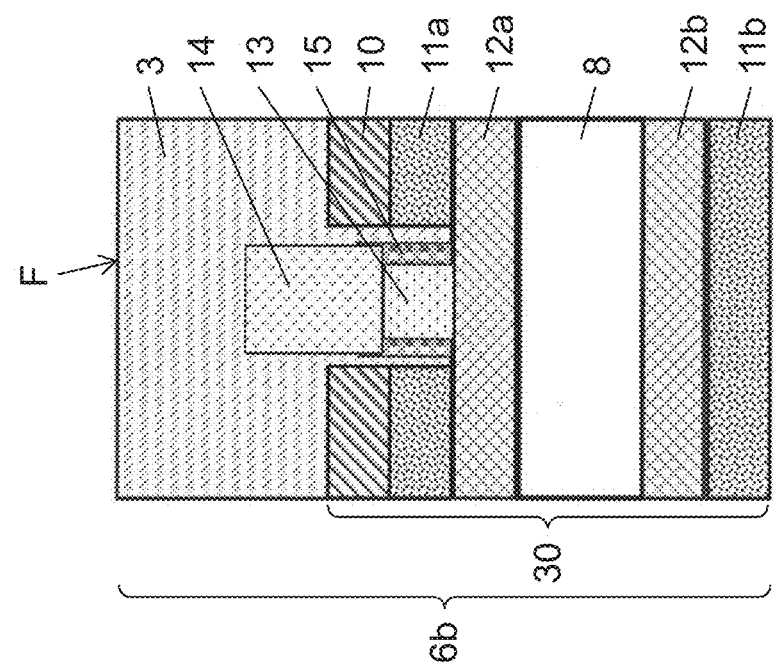

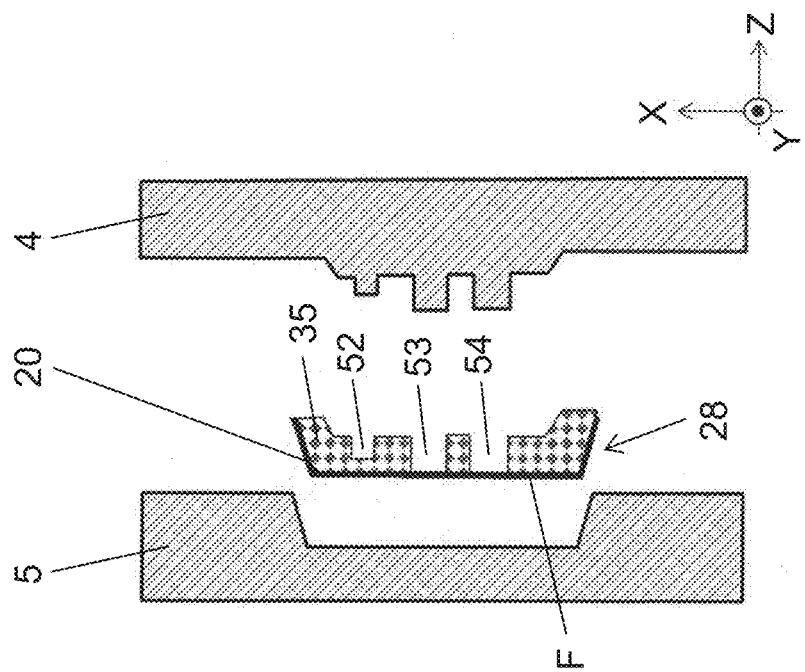
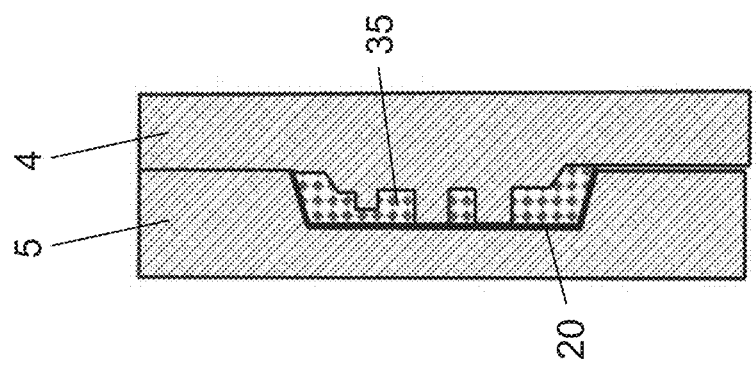
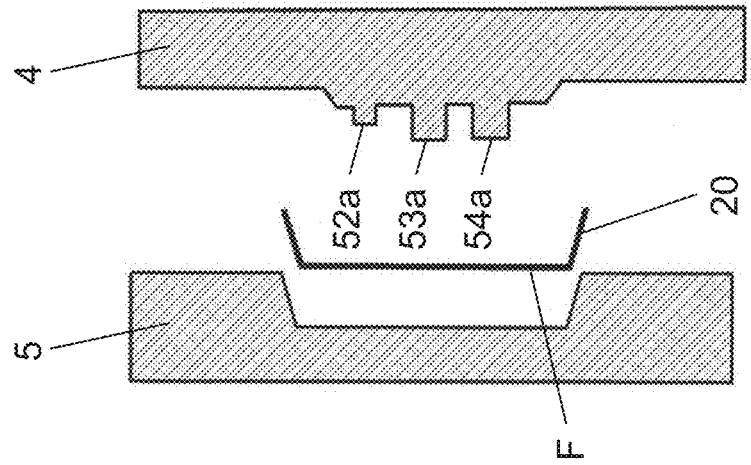

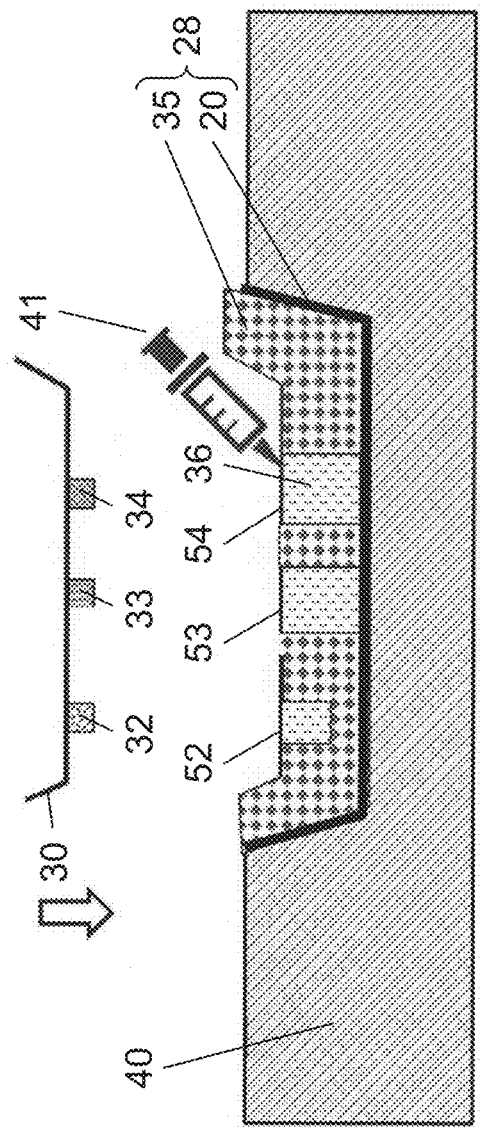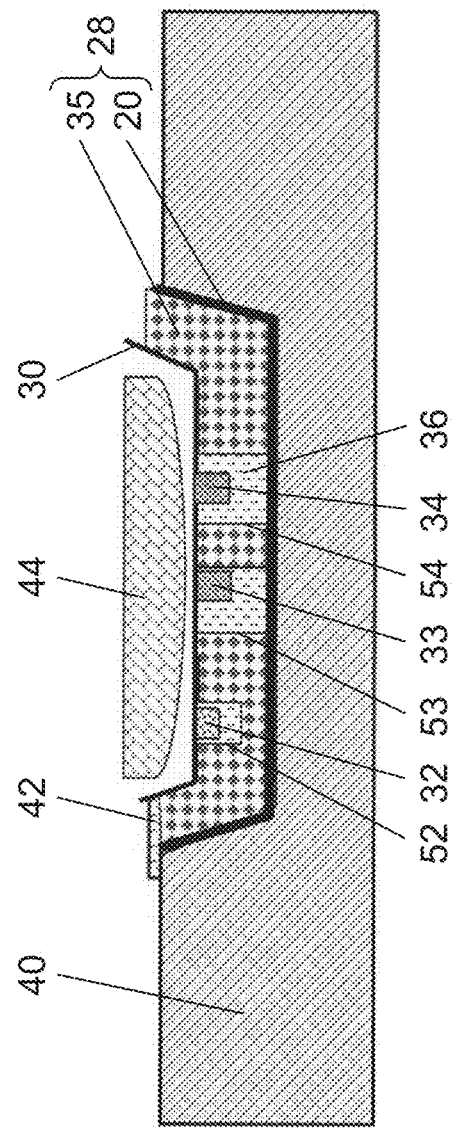

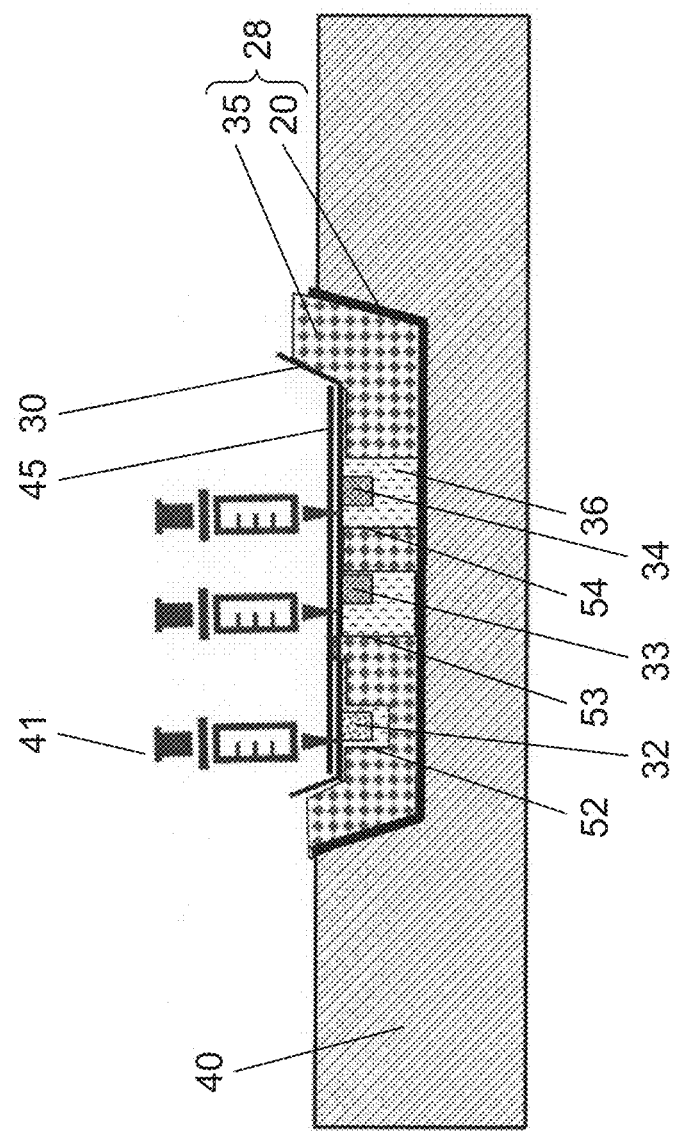

MOLDED BODY FOR ELECTRONIC FUNCTION, METHOD FOR MANUFACTURING THE SAME, AND OPERATION DEVICE USING MOLDED BODY FOR ELECTRONIC FUNCTION

BACKGROUND

1. Technical Field

The present disclosure relates to a molded body for an electronic function, on which an electronic circuit, an electronic component, or the like is incorporated in an insert molded body, a method for manufacturing the same, and an operation device using the molded body for an electronic function.

2. Description of the Related Art

In recent years, a method called a resin film insert molding has been widely applied to the manufacture of home appliances and automobile components. The insert molding is a kind of resin molding method and is a method of injecting resin into a molding mold loaded with an insert film (metal components or the like), a method of wrapping the loaded insert film with molten resin and solidifying the loaded insert film, and a method of molding a composite component in which resin and an insert film are integrated.

A general insert molding process will be briefly described with reference to FIGS. 19A to 19C. As illustrated in FIG. 19A, first, insert film 26 molded in a shape of a product to be manufactured in advance is installed in a molding mold (fixed side mold 4, movable side mold 5). At this time, insert film 26 is in contact with either fixed side mold 4 or movable side mold 5. Next, as illustrated in FIG. 19B, fixed side mold 4 and movable side mold 5 are clamped, and injection molding resin 3 is injected into the molding mold and fills a space between insert film 26 and the molding mold (fixed side mold 4 in FIG. 19B). Finally, after injection molding resin 3 that is full in the space between insert film 26 and the molding mold solidifies, the completed insert molded body is picked up from the molding mold (FIG. 19C), and insert molded body 6 in which insert film 26 and injection molding resin 3 are integrated is obtained.

The insert molded body can be formed into three types depending on whether the insert film is disposed on external appearance surface F side of a product or disposed on a side opposite to the external appearance surface F. FIGS. 20A to 20C are views illustrating three types of insert molded bodies. Front insert molded body 6a (FIG. 20A) in which insert film 26 is disposed on external appearance surface F side of the product, back insert molded body 6b (FIG. 20B) in which insert film 26 is disposed on a side opposite to the external appearance surface F of the product, and double insert molded body 6c (FIG. 20C) in which insert film 26 is disposed on both sides of the product are illustrated.

The insert molding method is used as a free surface decoration method and can manufacture a molded body for decoration that expresses a high degree of design and a sense of quality (for example, the exterior of a home appliance, the interior of an automobile, or the like). By mounting various electronic circuits or electronic components on the insert film and incorporating the electronic circuits or electronic components in the insert molded body, a flexible molded body having highly integrated electronic functions (for example, operation panel, memory card, or the like) can be realized.

As for the insert molded body incorporating an electronic component, for example, Japanese Patent No. 4969424 discloses an external appearance case for an electronic apparatus. The external appearance case for an electronic apparatus is formed by embedding a first film having transparency and flexibility on which characters, figures, or the like are printed, and a second film having transparency and flexibility on which a predetermined conductive pattern is formed, inside a kind of synthetic resin.

SUMMARY

According to an aspect of the present disclosure, there is provided a molded body for an electronic function including: a first film including a first surface serving as an external appearance surface; a second film including a surface on which an electronic component is mounted, the surface facing a second surface of the first film opposite to the external appearance surface; and a first resin that fills a space between the first film and the second film, wherein the first resin has a cavity, and the cavity is filled with a second resin, and the electronic component is disposed in the cavity and surrounded by the second resin.

According to another aspect of the present disclosure, there is provided a method for manufacturing a molded body for an electronic function including: step 1 of preparing a first film in which one surface thereof constitutes an external appearance surface; step 2 of preparing a second film in which an electronic component is mounted on one surface thereof; step 3 of forming an intermediate molded body in which the first film and a first molten resin are integrated by installing the first film in a mold, injecting the first molten resin, and solidifying the first molten resin such that a cavity is formed in the first molten resin which is bonded to a surface of the first film opposite to the external appearance surface; step 4 of pasting the second film to the intermediate molded body such that the electronic component is disposed in the cavity so as to be surrounded by the second molten resin in the cavity after the cavity is filled with a second molten resin; and step 5 of forming a molded body, in which the second film on which the electronic component is mounted and the intermediate molded body are integrated, by solidifying the second molten resin.

BRIEF DESCRIPTION OF THE DRAWINGS

FIG. 3 is a flowchart illustrating a manufacturing process of the molded body for an electronic function according to the exemplary embodiment of the present disclosure;

FIG. 4A is a view illustrating a configuration of an insert film base material for an external appearance surface in the manufacturing process of the molded body for an electronic function according to the exemplary embodiment of the present disclosure, and is a view illustrating a cross-sectional configuration of the insert film base material for an external appearance surface;

FIG. 4B is a view illustrating a configuration of an insert film base material for an external appearance surface in the manufacturing process of the molded body for an electronic function according to the exemplary embodiment of the present disclosure, and is a view illustrating a cross-sectional configuration in which a light transmitter is provided in a pattern layer;

FIG. 4C is a view illustrating a configuration of an insert film base material for an external appearance surface in the manufacturing process of the molded body for an electronic function according to the exemplary embodiment of the present disclosure, and is a view illustrating a shape of the light transmitter which is expressed transparently on the external appearance surface;

FIG. 5A is a view illustrating a configuration of one modification example of an insert film base material for an external appearance surface in the manufacturing process of the molded body for an electronic function according to the exemplary embodiment of the present disclosure, and is a view illustrating a cross-sectional configuration of the insert film base material for an external appearance surface using veneer;

FIG. 5B is a view illustrating a configuration of one modification example of an insert film base material for an external appearance surface in the manufacturing process of the molded body for an electronic function according to the exemplary embodiment of the present disclosure, and is a view illustrating a cross-sectional configuration in which a light transmitter is provided in a pattern layer;

FIG. 5C is a view illustrating a configuration of one modification example of an insert film base material for an external appearance surface in the manufacturing process of the molded body for an electronic function according to the exemplary embodiment of the present disclosure, and is a view illustrating a shape of the light transmitter which is expressed transparently on the external appearance surface using veneer;

FIG. 6A is a view illustrating a configuration of an insert film base material for imparting an electronic function in the manufacturing process of the molded body for an electronic function according to the exemplary embodiment of the present disclosure, and is a view illustrating a cross-sectional configuration of the insert film base material for imparting an electronic function on which an electronic component is mounted;

FIG. 6B is a view illustrating a configuration of an insert film base material for imparting an electronic function in the manufacturing process of the molded body for an electronic function according to the exemplary embodiment of the present disclosure, and is a view illustrating a cross-sectional configuration of one modification example of the insert film base material for imparting an electronic function;

FIG. 9A is a cross-sectional view illustrating a configuration of a front insert molded body in which an electronic function imparting film is embedded on the external appearance surface side, and is a view illustrating Configuration Example 1 of the front insert molded body;

FIG. 9B is a cross-sectional view illustrating a configuration of a front insert molded body in which an electronic function imparting film is embedded on the external appearance surface side, and is a view illustrating Configuration Example 2 of the front insert molded body;

FIG. 10A is a cross-sectional view illustrating a configuration of a back insert molded body in which an electronic function imparting film is embedded on a side opposite to the external appearance surface and is a view illustrating Configuration Example 1 of the back insert molded body;

FIG. 10B is a cross-sectional view illustrating a configuration of a back insert molded body in which an electronic function imparting film is embedded on the side opposite to the external appearance surface and is a view illustrating Configuration Example 2 of the back insert molded body;

FIG. 13A is a view illustrating a molding step of an intermediate molded body in the manufacturing process of the molded body for an electronic function according to the exemplary embodiment of the present disclosure, and is a cross-sectional view illustrating a step of installing an external appearance surface film in a molding mold;

FIG. 13B is a view illustrating a molding step of an intermediate molded body in the manufacturing process of the molded body for an electronic function according to the exemplary embodiment of the present disclosure, and is a cross-sectional view illustrating a step of clamping the molding mold and filling a side opposite to the external appearance surface of the external appearance surface film with a first molten resin;

FIG. 13C is a view illustrating a molding step of an intermediate molded body in the manufacturing process of the molded body for an electronic function according to the exemplary embodiment of the present disclosure, and is a cross-sectional view illustrating a step of picking up a completed intermediate molded body from a molding mold after the first molten resin that is full in the side opposite to the external appearance surface of the external appearance surface film solidifies;

FIG. 14A is a view illustrating a step of pasting an electronic function imparting film in the manufacturing process of the molded body for an electronic function according to the exemplary embodiment of the present disclosure, and is a cross-sectional view illustrating a step of injecting a second molten resin into a cavity that is formed in the intermediate molded body;

FIG. 14B is a view illustrating a step of pasting an electronic function imparting film in the manufacturing process of the molded body for an electronic function according to the exemplary embodiment of the present disclosure, and is a cross-sectional view illustrating a step of pasting the electronic function imparting film to the intermediate molded body;

FIG. 15 is a view illustrating one modification example of a step of pasting an electronic function imparting film in the manufacturing process of the molded body for an electronic function according to the exemplary embodiment of the present disclosure, and is a cross-sectional view illustrating a step of injecting a second molten resin into a cavity, in which an electronic component is accommodated, after the electronic function imparting film is pasted to the intermediate molded body;

DETAILED DESCRIPTIONS

Figure 1:
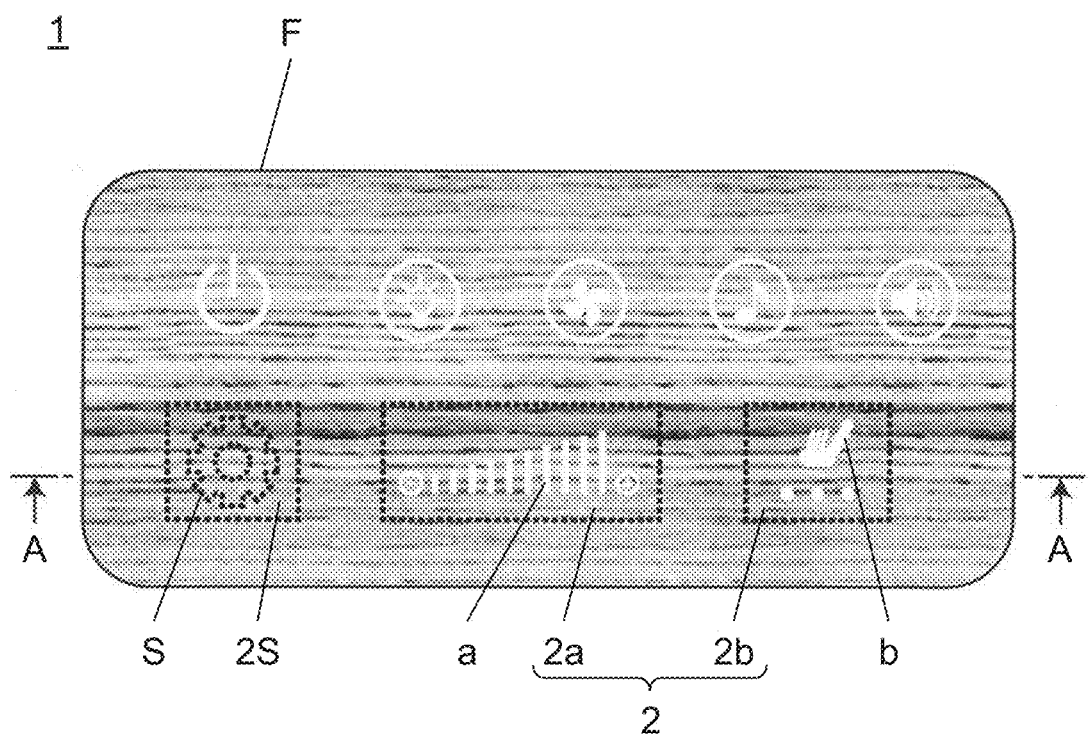
FIG. 1 is a top view illustrating an external appearance surface of an operation device using a molded body for an electronic function according to an exemplary embodiment of the present disclosure.

In an insert molding process in the related art, since it is necessary to apply heat and pressure when an injection molding resin fills a molding mold, damage such as thermal deterioration or package deformation occurs in an electronic component mounted on an insert film by applying the heat and pressure. An insert molded body having an electronic function manufactured in this way has a problem that an operational stability of the incorporated electronic component cannot be guaranteed.

An object of the present disclosure is to solve the above-mentioned problems and to provide a molded body for an electronic function and a method for manufacturing the same, which can avoid damage such as thermal deterioration or package deformation of an electronic component due to an insert molding process in the related art.

According to a first aspect of the present disclosure, there is provided a molded body for an electronic function including: a first film in which one surface thereof constitutes an external appearance surface; a second film in which an electronic component is mounted on a surface thereof facing a surface of the first film opposite to the external appearance surface; and a first resin that fills a space between the first film and the second film, in which the first resin has a cavity, and the cavity is filled with a second resin, and the electronic component is disposed in the cavity and surrounded by the second resin.

According to a second aspect of the present disclosure, there is provided the molded body for an electronic function of the first aspect, in which at least a part of the cavity is provided from the first film to the second film, the electronic component accommodated in the cavity which is provided from the first film to the second film is a light emitting element, and light emitted from the light emitting element passes through the second resin, and a predetermined region on the surface of the first film opposite to the external appearance surface is irradiated with the light.

According to a third aspect of the present disclosure, there is provided the molded body for an electronic function of the second aspect, in which the second resin around the light emitting element has a higher transmittance than a transmittance of the first resin at a light emitting wavelength of the light emitting element, and the first resin has a higher reflectance than a reflectance of the second resin at the light emitting wavelength of the light emitting element.

According to a fourth aspect of the present disclosure, there is provided the molded body for an electronic function of the second or third aspect, in which the first resin has a reflectance of 95% or more at a light emitting wavelength of the light emitting element.

According to a fifth aspect of the present disclosure, there is provided the molded body for an electronic function of any one of the second to fourth aspects, in which the second resin has a transmittance of 90% or more at a light emitting wavelength of the light emitting element.

According to a sixth aspect of the present disclosure, there is provided the molded body for an electronic function of any one of the second to fifth aspects, in which the cavity provided from the first film to the second film has an inclined portion in which an inner wall formed of the first resin is inclined with respect to the external appearance surface, and of the light emitted from the light emitting element, light incident on the inclined portion is reflected to the predetermined region.

According to a seventh aspect of the present disclosure, there is provided the molded body for an electronic function of any one of the first to sixth aspects, in which the first resin is a thermoplastic resin.

According to an eighth aspect of the present disclosure, there is provided the molded body for an electronic function of any one of the first to seventh aspects, in which the second resin is a curable resin and has a curing temperature lower than a molding temperature of the first resin.

According to a ninth aspect of the present disclosure, there is provided the molded body for an electronic function of the eighth aspect, in which the second resin has a curing temperature of 100° C. or lower.

According to a tenth aspect of the present disclosure, there is provided the molded body for an electronic function of the ninth aspect, in which the second resin is one type of a thermosetting resin, a UV curable resin, a radiation curable resin, and a two-component curable resin.

According to an eleventh aspect of the present disclosure, there is provided the molded body for an electronic function of any one of the first to tenth aspects, in which the electronic component is mounted on the second film via a conductive ink.

According to a twelfth aspect of the present disclosure, there is provided a method for manufacturing a molded body for an electronic function including: step 1 of preparing a first film in which one surface thereof constitutes an external appearance surface; step 2 of preparing a second film in which an electronic component is mounted on one surface thereof; step 3 of forming an intermediate molded body in which the first film and a first molten resin are integrated by installing the first film in a mold, injecting the first molten resin, and solidifying the first molten resin such that a cavity is formed in the first molten resin which is bonded to a surface of the first film opposite to the external appearance surface; step 4 of pasting the second film to the intermediate molded body such that the electronic component is disposed in the cavity so as to be surrounded by the second molten resin in the cavity after the cavity is filled with a second molten resin; and step 5 of forming a molded body, in which the second film on which the electronic component is mounted and the intermediate molded body are integrated, by solidifying the second molten resin.

According to a thirteenth aspect of the present disclosure, there is provided the method for manufacturing a molded body for an electronic function of the twelfth aspect, in which the step 4 is replaced by step 6 of filling the cavity with the second molten resin such that the electronic component accommodated in the cavity is surrounded by the second molten resin after the second film is pasted to the intermediate molded body such that the electronic component is disposed in the cavity.

According to a fourteenth aspect of the present disclosure, there is provided an operation device including: the molded body for an electronic function of any one of the second to sixth aspects, in which the first film includes a light transmitter having a predetermined shape representing an operation instruction in the predetermined region, and a display indicating the operation instruction by displaying the predetermined shape when the light transmitter is irradiated with light on the external appearance surface, the second film is provided with an electrostatic sensor, and the electrostatic sensor detects the operation instruction by detecting a conductive indicator that approaches the display.

According to a fifteenth aspect of the present disclosure, there is provided the operation device of the fourteenth aspect, in which an electronic component accommodated in the cavity includes an electronic component that is not visually recognized from the external appearance surface of the first film.

According to a sixteenth aspect of the present disclosure, there is provided the operation device of the fourteenth or fifteenth aspect, in which the light emitting element is a top illumination type LED or a side illumination type LED.

As described above, according to the molded body for an electronic function and a method for manufacturing the molded body for an electronic function of the present disclosure, it is possible to avoid thermal deterioration or package deformation of an electronic component due to an injection molding in an insert molded body having an electronic function.

Hereinafter, an exemplary embodiment of the present disclosure will be described with reference to the drawings. Each of the exemplary embodiments described below indicates a desired specific example of the present disclosure. Therefore, a numerical value, a shape, a material, configuration elements, disposition positions of the configuration elements, a coupling form, and the like indicated in the following exemplary embodiment are specific examples according to the present disclosure and do not limit the present disclosure. Thereby, among the configuration elements in the following exemplary embodiment, the configuration elements that are not described in the independent claims indicating the highest concept of the present disclosure are described as any configuration elements. Appropriate changes can be made without departing from the scope of the effect of the present disclosure. Combinations with other exemplary embodiments are possible.

Each drawing illustrates a schematic view and is not necessarily strictly illustrated.

In each drawing, the substantially same configurations are denoted by the same reference numerals, and overlapping description will be omitted or simplified.

Exemplary Embodiment

First, an overall configuration of an operation device using a molded body for an electronic function according to the exemplary embodiment of the present disclosure will be described.

Figure 2:
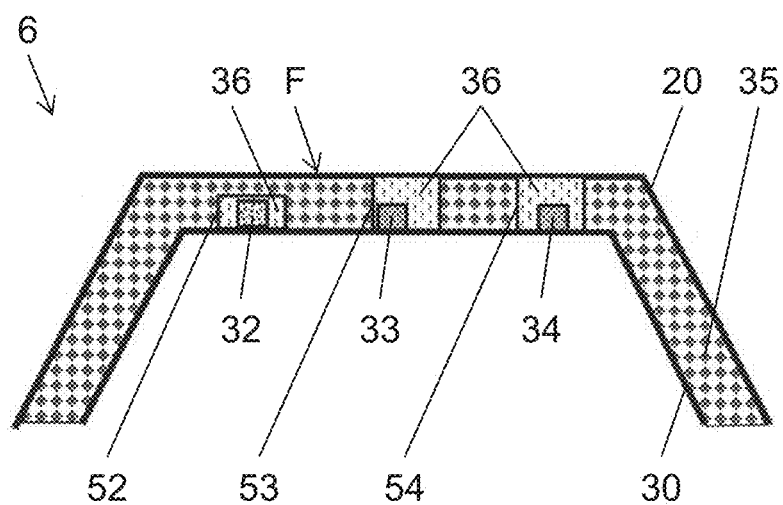
FIG. 2 is a cross-sectional view taken along the line II-II of the molded body for an electronic function used in the operation device in FIG. 1.

FIG. 1 is a top view illustrating an external appearance surface of the operation device using the molded body for an electronic function according to the exemplary embodiment of the present disclosure, and FIG. 2 is a cross-sectional view taken along the line II-II of the molded body for an electronic function in the operation device in FIG. 1.

Operation device 1 illustrated in FIG. 1 has display 2 on external appearance surface F, and display 2 includes display regions 2a and 2b indicating various operation instructions by marks a and b. Marks a and b may be, for example, any figures, characters, patterns, or numbers represented by 7 segments, or may be any set by a user. The user can set any design such as the size, number, or display position of marks a and b.

In region 2s on external appearance surface F illustrated in FIG. 1, shape s that cannot be visually recognized from external appearance surface F is disposed. Shape s is a shape seen from a top view of electronic component 32 (illustrated in FIG. 2).

FIG. 2 is a cross-sectional view taken along the line II-II of the molded body 6 for an electronic function used in operation device illustrated in FIG. 1. Molded body 6 for an electronic function includes external appearance surface film 20 and electronic function imparting film 30, and a space between external appearance surface film 20 and electronic function imparting film 30 is filled with first resin 35. In electronic function imparting film 30, electronic components 32, 33, and 34 are mounted on a surface facing external appearance surface film 20. Electronic components 32, 33, and 34 are respectively disposed in cavities 52, 53, and 54 which are formed of first resin 35, and are surrounded by second resin 36 in cavities 52, 53, and 54. Electronic function imparting film 30 is provided with an electrostatic sensor that detects an operation instruction indicated on display 2 (not illustrated in FIGS. 1 and 2 and will be described later).

A part of the electronic components mounted on electronic function imparting film 30, for example, electronic components 33 and 34 are light emitting elements. Light emitting elements 33 and 34 are accommodated in cavities 53 and 54 provided from external appearance surface film 20 to electronic function imparting film 30. By operating light emitting elements 33 and 34, light which is emitted from each of light emitting elements 33 and 34 passes through second resin 36 in cavities 53 and 54, and corresponding display regions 2a and 2b of display 2 on external appearance surface F can be irradiated with the light, thereby the operation instructions indicated in irradiated display regions 2a and 2b are visually recognized by the user. When the user approaches the display region, for example, with a conductive indicator such as a finger, an operation instruction indicated in the display region is detected by the electrostatic sensor, and the user can perform a desired operation. On the other hand, incorporated electronic component 32 in region 2s on external appearance surface F is accommodated in cavity 52, and shape s of electronic component 32 cannot be visually recognized from external appearance surface F of operation device 1.

Molded body 6 for an electronic function configured in this way can avoid damage such as thermal deterioration or package deformation of electronic components 32, 33, and 34 due to the insert molding process in the related art, and an operational stability of the incorporated electronic components can be guaranteed. By making it possible to control the illumination regions of light emitting elements 33 and 34 incorporated in the molded body and making electronic component 32 visually unrecognizable from the outside, the security is ensured and the reliability of the product is guaranteed.

In operation device 1 provided with molded body 6 for an electronic function, when the incorporated light emitting element is turned off, the original color tone of the external appearance surface of the product is visually recognized. By providing a decorative design on the external appearance surface film, it is possible to express a free design, for example, the color of natural wood. When the light emitting element is turned on, a mark indicating an operation instruction provided on the external appearance surface film (the back side of the external appearance surface) is transparently displayed on the display of the external appearance surface, and the user can visually recognize an operation display even in a dark place and can easily operate the operation display by touching the display region indicating the desired operation instruction.

Manufacturing Process of Molded Body for Electronic Function

FIG. 3 is a flowchart illustrating a manufacturing process of molded body 6 for an electronic function according to the exemplary embodiment of the present disclosure. The manufacturing process of molded body 6 for an electronic function will be described with reference to FIG. 3.

(1) First, in step S10, an insert film base material for an external appearance surface and an insert film base material for imparting an electronic function are prepared.

(2) Next, in step S20, an external appearance surface film and an electronic function imparting film are prepared.

(3) Subsequently, in step S30, a first resin fills a space between the external appearance surface film and a mold, and an intermediate molded body in which the external appearance surface film and the first resin are integrated is formed.

(4) Next, in step S40, a second resin fills a cavity, and the electronic function imparting film is pasted to the intermediate molded body.

(5) Finally, in step S50, a molded body for an electronic function in which the electronic function imparting film and the intermediate molded body are integrated is formed.

Each of the steps will be described in detail below.

Step S10 of Preparing Insert Film Base Material for External Appearance Surface and Insert Film Base Material for Imparting Electronic Function The formation of the insert film base material for an external appearance surface and the insert film base material for imparting an electronic function in step S10 will be described in detail with reference to FIGS. 4 to 6.

FIGS. 4A to 4C are views illustrating a configuration of the insert film base material for an external appearance surface in the manufacturing process of the molded body for an electronic function according to the exemplary embodiment of the present disclosure. FIG. 4A illustrates a cross-sectional configuration of insert film base material 25 for an external appearance surface, and insert film base material 25 for an external appearance surface is constituted by surface function layer 7, base material film 8, pattern layer 9, and adhesive layer 10 from external appearance surface F side of the product.

Surface function layer 7 is a layer provided to prevent the occurrence of scratches or damage on the external appearance surface of the insert molded body, to increase the depth of the pattern of pattern layer 9, to prevent deterioration of the insert molded body due to ultraviolet rays, or for antifouling. Surface function layer 7 may be configured using an ultraviolet curable resin, a radiation curable resin, or a thermosetting resin.

Base material film 8 is a layer that plays a role as a carrier film for coating surface function layer 7, pattern layer 9, and adhesive layer 10. Base material film 8 may be made of a material such as polyethylene terephthalate, polycarbonate, polyimide, polyethylene naphthalate, or polymethyl methacrylate resin (PMMA).

Pattern layer 9 is a layer provided to give a design to the external appearance surface. Pattern layer 9 may be configured using an organic pigment and a polyvinyl resin, a polyamide resin, a polyester resin, an acrylic resin, or a polyurethane resin. By forming a metal foil film such as aluminum, tin, or indium on pattern layer 9 by using a method such as sputtering or vacuum deposition, it is possible to give a mirror-like design to the external appearance surface.

Adhesive layer 10 is a layer that plays a role of tightly adhering the injection molding resin and pattern layer 9. Adhesive layer 10 may be configured using a polyacrylic resin, a polystyrene resin, a polycarbonate resin, or a polyamide resin having an affinity with respect to both the injection molding resin and pattern layer 9.

FIG. 4B is a cross-sectional view illustrating a configuration of insert film base material 25a in which pattern layer 9 is provided with a light transmitter. In insert film base material 25a, pattern layer 9 is provided with light transmitter 17a by patterning, and a portion excluding light transmitter 17a is formed so as not to transmit light. For surface function layer 7, base material film 8, pattern layer 9, and adhesive layer 10, a transparent or translucent material that allows light to pass through is used. When such an insert film base material is used, as illustrated in FIG. 4C, light emitted from a light emitting element such as an LED that is incorporated in a molded body passes through light transmitter 17a, whereby a shape of light transmitter 17a appears on external appearance surface F. Therefore, by forming a shape of the light transmitter into a predetermined display mark, an insert molded body having a display function can be configured.

Modification Example of Insert Film Base Material for External Appearance Surface FIGS. 5A to 5C are views illustrating a configuration of one modification example of the insert film base material for an external appearance surface. In the modification example, the texture of the material itself can be applied to the external appearance surface of the insert molded body. FIG. 5A is a cross-sectional view illustrating a configuration of insert film base material 25b for an external appearance surface using a veneer. The veneer refers to a sheet shaped plate material obtained by thinly slicing wood, for example, a sliced sheet shaped plate material having a light transmittance of 5% or more and 30% or less, and a plate thickness of 0.1 mm or more and 0.6 mm or less. The surface of the veneer can express unevenness derived from Motoki.

Insert film base material 25b for an external appearance surface using a veneer is constituted by surface function layer 7, veneer 27, adhesive layer 10, pattern layer 9, base material film 8, and adhesive layer 10 from external appearance surface F side of the product. By changing veneer 27 to artificial leather, genuine leather, or stone, the texture of the external appearance surface of the insert molded body can be changed. FIG. 5B is a cross-sectional view illustrating a configuration in which light transmitter 17c is provided on a pattern layer of insert film base material 25c for an external appearance surface using a veneer. Since veneer 27 has a constant light transmittance, as illustrated in FIG. 5C, light emitted from a light emitting element such as an LED that is incorporated in a molded body passes through light transmitter 17c, whereby a shape of light transmitter 17c appears transparently on external appearance surface F. In this way, by a decoration method using a veneer or the like, the appearance, touch, glossiness, or the like of the surface can be freely changed, various designs can be expressed, and an insert molded body having a display function can be configured.

FIGS. 6A to 6B are views illustrating a configuration of an insert film base material for imparting an electronic function in the manufacturing process of the molded body for an electronic function according to the exemplary embodiment of the present disclosure. FIG. 6A is a cross-sectional view illustrating a configuration of insert film base material 35 for imparting an electronic function on which electronic component 14 is mounted. Insert film base material 35 for imparting an electronic function is configured by disposing adhesive layer 10, resist layer 11, conductive ink layer 12a, base material film 8, conductive ink layer 12b, and resist layer 11 in this order. Electronic component 14 is mounted on conductive ink layer 12a via conductive adhesive 13 and underfill 15.

Resist layer 11 is provided to prevent conductive ink layers 12a and 12b applied to base material film 8 from being oxidized in the air or deterioration due to ultraviolet rays and may be configured using an ultraviolet curable resin, a radiation curable resin, or a thermosetting resin.

For conductive ink layers 12a and 12b, the conductive ink used is made of a resin and a filler of a metal material such as silver, gold, or copper. Base material film 8 can have a function of a circuit board by printing a wiring pattern on base material film 8 by a screen printing apparatus, an ink jet printing apparatus, a gravure printing apparatus, or an etching method using the conductive ink. Not only a hard (rigid) board but also a flexible board (flexible printed circuit: FPC) can be formed. Since multiple branch three-dimensional wiring can be formed by combining a plurality of shapes, it is possible to realize a three-dimensional shape circuit board.

Resist layer 11 and adhesive layer 10 are not disposed in a part of conductive ink layer 12a, and conductive adhesive 13 is disposed on a portion of exposed conductive ink layer 12a and electronic component 14 is mounted on conductive adhesive 13, thereby base material film 8 can be provided with an electronic function.

Conductive adhesive 13 is made of a resin and a filler of a metal material such as silver, gold, or copper, and is provided to conduct conductive ink layer 12a with electronic component 14 in which a metal material or resin having a low melting point such as solder is mixed. Conductive adhesive 13 can be disposed by a screen printing apparatus or dispenser coating.

Underfill 15 is disposed so that the electronic component does not fall off from insert film base material 35 when the adhesion between electronic component 14 and conductive adhesive 13 is insufficient with conductive adhesive 13 alone. After electronic component 14 is mounted, by the dispenser coating, underfill 15 can be disposed so as to cover an exposed portion of conductive ink layer 12a, a side end portion of conductive adhesive 13, and an end portion of a mounting surface of electronic component 14. Underfill 15 may be configured using an ultraviolet curable resin, a radiation curable resin, or a thermosetting resin.

By providing conductive ink layer 12a and resist layer 11a, and conductive ink layer 12b and resist layer 11b on both sides of base material film 8, respectively, electronic functions can be imparted to both sides of base material film 8.

Modification Example of Insert Film Base Material for Imparting Electronic Function FIG. 6B is a view illustrating a configuration of one modification example of the insert film base material for imparting an electronic function. As illustrated in FIG. 6B, by further laminating conductive ink layer 12c and resist layer 11c, it is possible to form insert film base material 35a for imparting an electronic function having a multi-layered electronic circuit structure such as a printed board. Base material film 8 can be used instead of resist layer 11b illustrated in FIG. 6B (not illustrated).

In the present specification, a base material film used for insert film base material 25 for an external appearance surface and insert film base material 35 for imparting an electronic function have the same reference numerals, but the present disclosure is not limited to those made of the same material. The base material film used for the insert film base material for an external appearance surface and the insert film base material for imparting an electronic function may be made of different materials that can obtain the same effect as the carrier film depending on the use.

Step S20 of Preparing External Appearance Surface Film and Electronic Function Imparting Film The formation of the external appearance surface film and the electronic function imparting film in step S20 will be described in detail with reference to FIGS. 7A to 7B and 8A to 8B.

In step S20, an insert film molding is performed. The insert film includes the external appearance surface film and the electronic function imparting film. The insert film molding step is a step of molding a flat insert film base material (an insert film base material for an external appearance surface and an insert film base material for imparting an electronic function) into a shape of a product, and is also called a "vacuum pressure molding". FIGS. 7A to 7B and 8A to 8B illustrate an insert film molding step in the manufacturing process of the molded body for an electronic function according to the exemplary embodiment of the present disclosure.

Figure 7A:
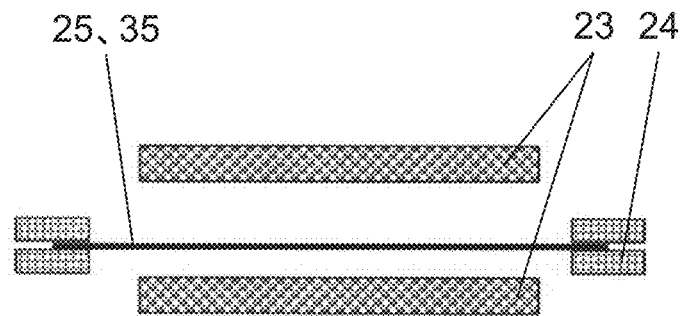
FIG. 7A is a view illustrating an insert film molding step in the manufacturing process of the molded body for an electronic function according to the exemplary embodiment of the present disclosure, and is a view illustrating a state where an insert film base material is fixed and heated.
Figure 7B:
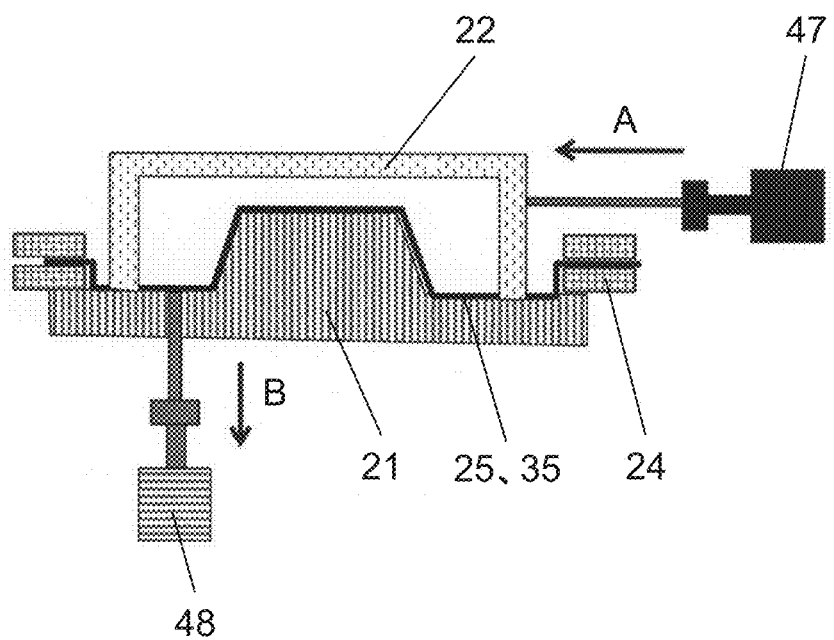
FIG. 7B is a view illustrating an insert film molding step in the manufacturing process of the molded body for an electronic function according to the exemplary embodiment of the present disclosure, and is a view illustrating a state where an insert film base material is pressed into a vacuum molding mold to mold a shape of a product.

In the insert film molding, first, in FIG. 7A, flat insert film base materials 25 and 35 are fixed by using film clamp 24, and heater 23 heats insert film base materials 25 and 35 to a temperature equal to or higher than the glass transition temperature of the resin constituting insert film base materials 25 and 35. Next, in FIG. 7B, a shape of the product is molded by pressing insert film base materials 25 and 35 against vacuum molding mold 21. At this time, as illustrated in FIG. 7B, insert film base materials 25 and 35 are brought into a vacuum state in a state interposed between vacuum molding mold 21 and air pressure mold 22. The atmospheric pressure between insert film base materials 25 and 35, and air pressure mold 22 is increased by air pressure supply pump 47, and the degree of vacuum of insert film base materials 25 and 35 and vacuum molding mold 21 is increased by vacuum pump 48, thereby insert film base materials 25 and 35 can be molded more efficiently.

Figure 8A:
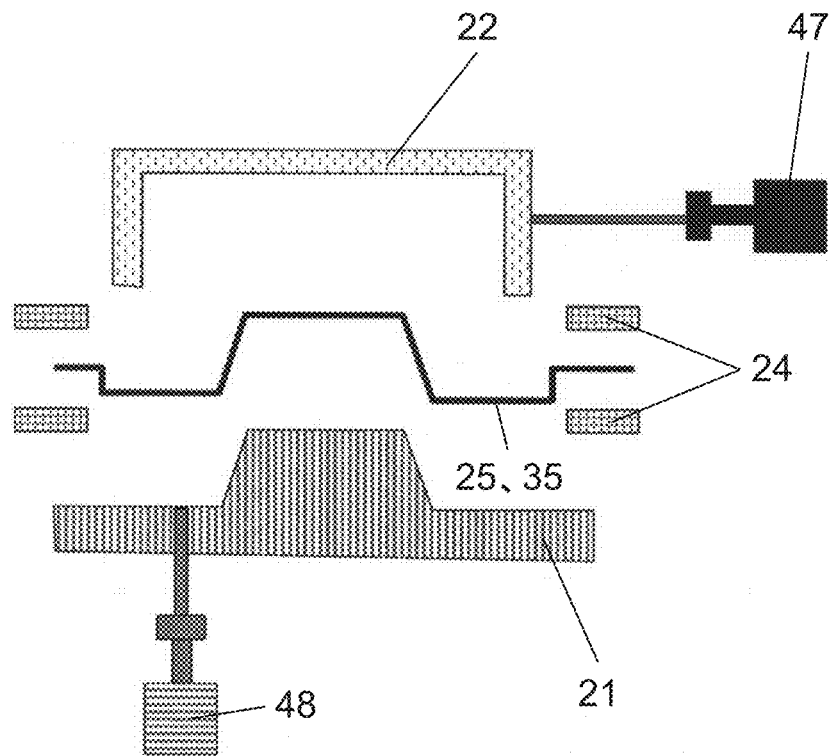
FIG. 8A is a view illustrating an insert film molding step in the manufacturing process of the molded body for an electronic function according to the exemplary embodiment of the present disclosure, and is a view illustrating a state where the molded insert film base material is open to the atmosphere.
Figure 8B:
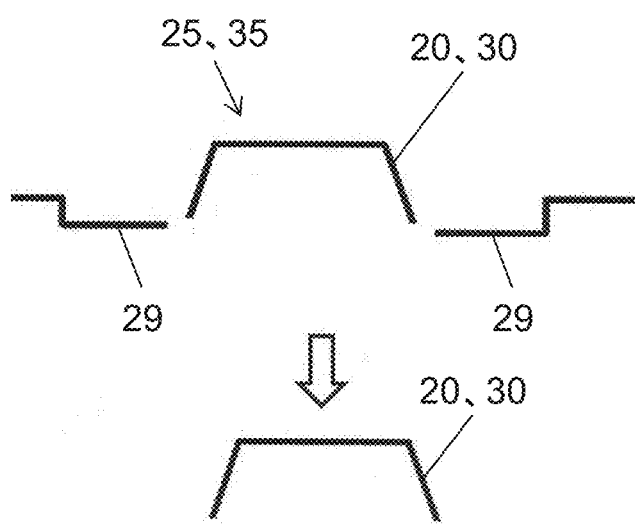
FIG. 8B is a view illustrating an insert film molding step in the manufacturing process of the molded body for an electronic function according to the exemplary embodiment of the present disclosure, and is a view illustrating a completed insert film which a surplus portion of the molded insert film base material is removed.

Subsequently, in FIG. 8A, film clamp 24, air pressure mold 22 and air pressure supply pump 47, vacuum molding mold 21 and vacuum pump 48 are released, and the molded insert film base materials 25 and 35 are open to the atmosphere. In FIG. 8B, surplus portion 29 in insert film base materials 25 and 35 is removed by a Thomson mold or machining (not illustrated) and completed external appearance surface film 20 and electronic function imparting film 30 are obtained.

Figure 20A:
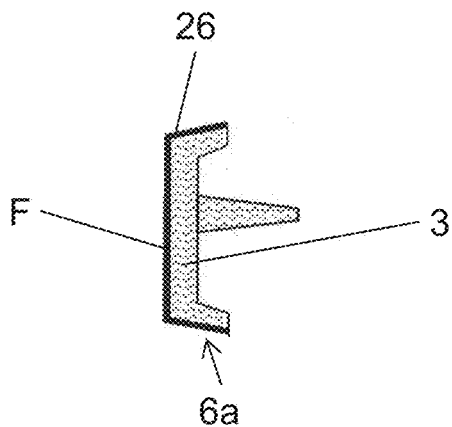
FIG. 20A is a cross-sectional view illustrating a front insert molded body, which is a type of insert molded body.
Figure 20B:
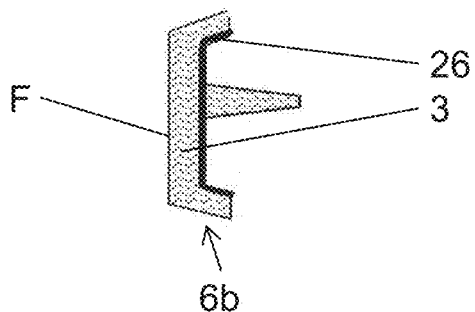
FIG. 20B is a cross-sectional view illustrating a back insert molded body, which is a type of insert molded body.
Figure 20C:
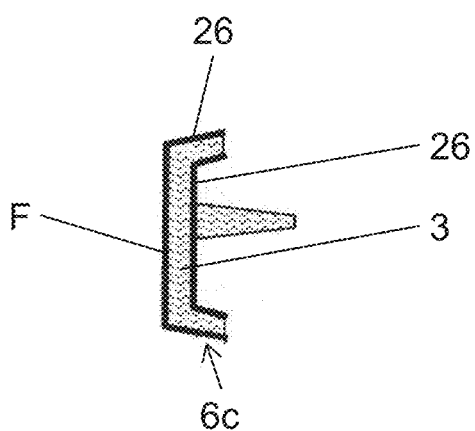
FIG. 20C is a cross-sectional view illustrating a double insert molded body, which is a type of insert molded body.

Configuration Example of Insert Molded Body Using Electronic Function Imparting Film The above-mentioned three types of insert molded bodies (FIG. 20) can be formed using obtained electronic function imparting film 30. FIGS. 9A to 9B are cross-sectional views illustrating a configuration of a front insert molded body in which an electronic function imparting film is embedded on the external appearance surface side. FIG. 9A illustrates Configuration Example 1 of the front insert molded body and illustrates a configuration of front insert molded body 6a on which electronic function imparting film 30 obtained by using insert film base material 35 for imparting an electronic function in FIG. 6A is disposed. FIG. 9B illustrates Configuration Example 2 of the front insert molded body and illustrates a configuration of front insert molded body 6a on which electronic function imparting film 30a obtained by using insert film base material 35a for imparting an electronic function in FIG. 6B is disposed.

FIGS. 10A to 10B are cross-sectional views illustrating a configuration of a back insert molded body in which an electronic function imparting film is embedded on a side opposite to the external appearance surface. FIG. 10A illustrates Configuration Example 1 of the back insert molded body and illustrates a configuration of back insert molded body 6b on which electronic function imparting film 30 obtained by using insert film base material 35 for imparting an electronic function in FIG. 6A is disposed. FIG. 10B illustrates Configuration Example 2 of the back insert molded body and illustrates a configuration of back insert molded body 6b on which electronic function imparting film 30a obtained by using insert film base material 35a for imparting an electronic function in FIG. 6B is disposed.

Figure 11B:
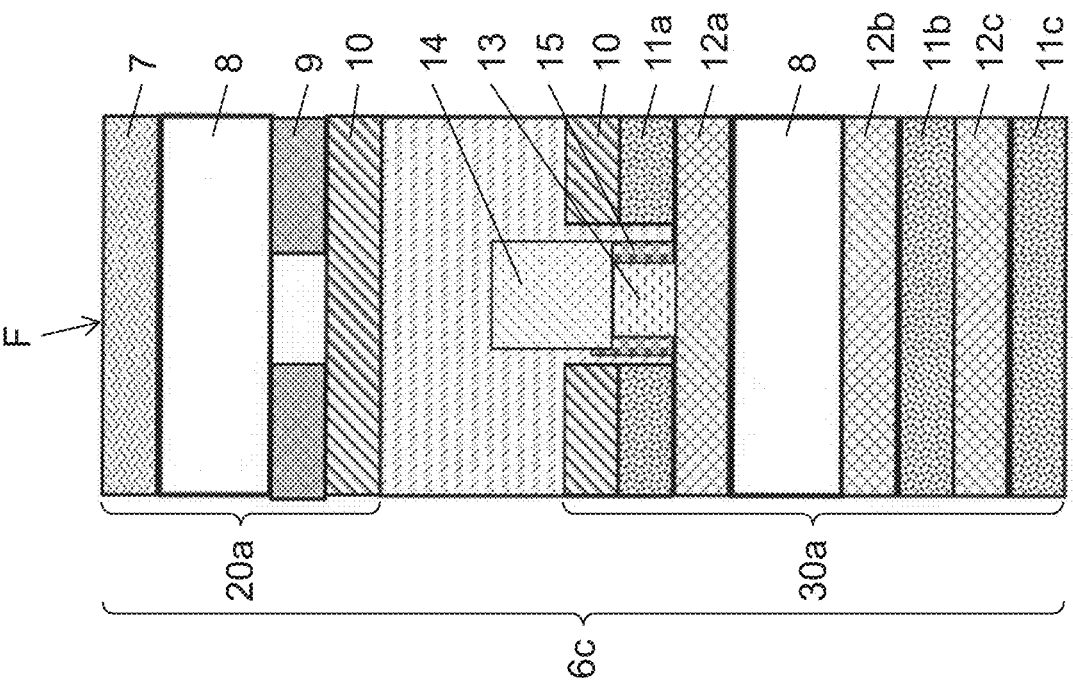
FIG. 11B is a cross-sectional view illustrating a configuration of a double insert molded body in which both an external appearance surface film and an electronic function imparting film are embedded, and is a view illustrating Configuration Example 2 of the double insert molded body.
Figure 11A:
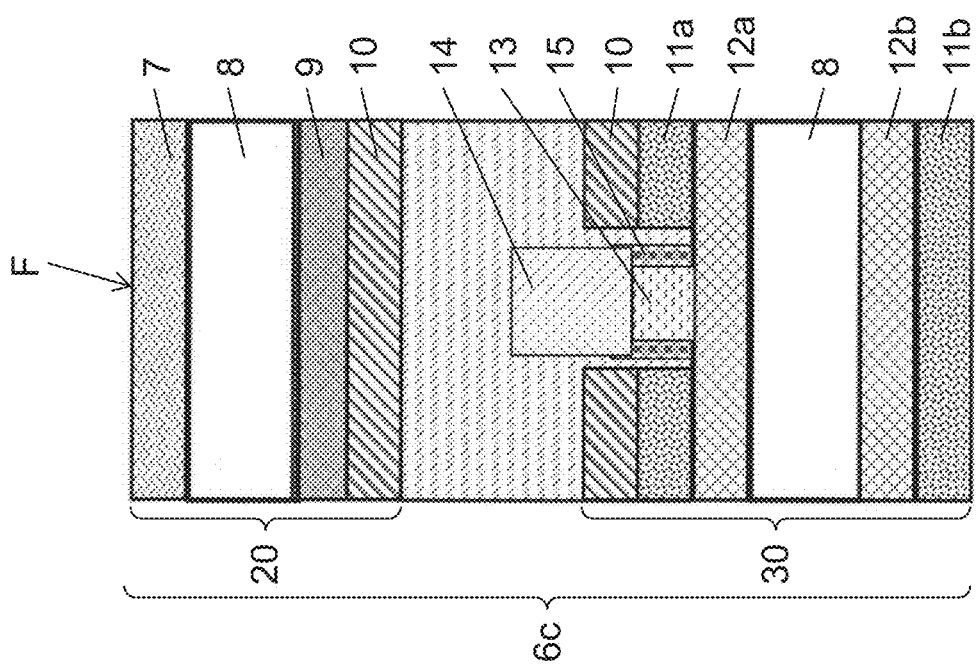
FIG. 11A is a cross-sectional view illustrating a configuration of a double insert molded body in which both an external appearance surface film and an electronic function imparting film are embedded, and is a view illustrating Configuration Example 1 of the double insert molded body.

FIGS. 11A to 11B are cross-sectional views illustrating a configuration of a double insert molded body in which both the external appearance surface film and the electronic function imparting film are embedded. FIG. 11A illustrates Configuration Example 1 of the double insert molded body and illustrates a configuration of double insert molded body 6c on which external appearance surface film 20 obtained by using insert film base material 25 for an external appearance surface in FIG. 4A and electronic function imparting film 30 obtained by using insert film base material 35 for imparting an electronic function in FIG. 6A are embedded. FIG. 11B illustrates Configuration Example 2 of the double insert molded body and illustrates a configuration of double insert molded body 6c on which external appearance surface film 20a obtained by using insert film base material 25a for an external appearance surface in FIG. 4B and electronic function imparting film 30a obtained by using insert film base material 35a for imparting an electronic function in FIG. 6B are embedded.

In this way, by configuring various types of insert molded bodies using the electronic function imparting film, it is possible to incorporate an electronic circuit or an electronic component into the insert molded body according to an actual application.

However, when an insert molded body is manufactured using the above-mentioned electronic function imparting film, there is a problem in the molding step in the related art. Problems existing in the molding step in the related art will be described in detail with reference to FIG. 12.

Figure 12:
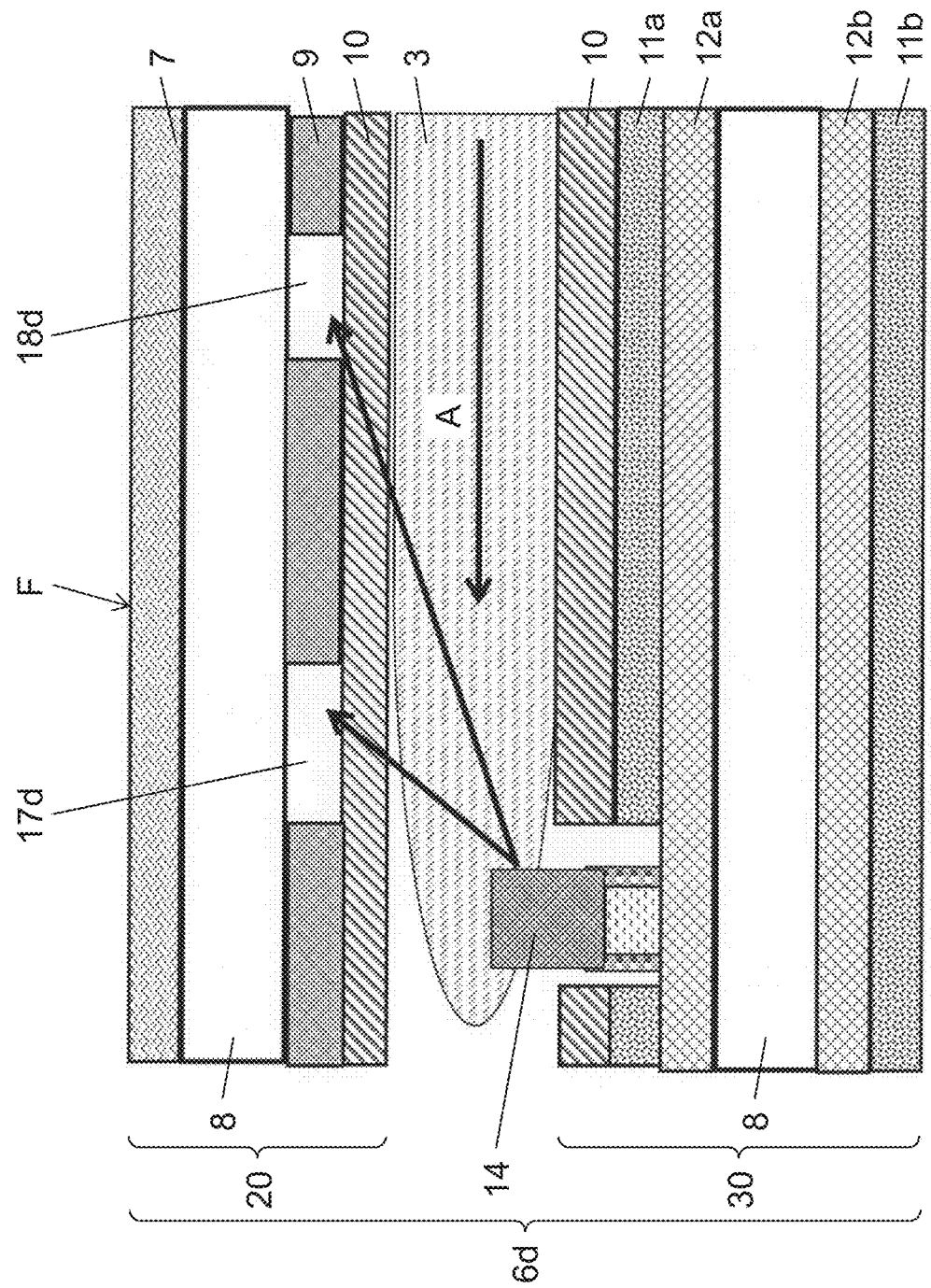
FIG. 12 is a view illustrating a molding process of an insert molded body using an electronic function imparting film according to a technique in the related art.

FIG. 12 illustrates a molding step in a case of manufacturing insert molded body 6d using an electronic function imparting film by using the technique in the related art temporarily. As illustrated in FIG. 12, in the molding step of insert molded body 6d, injection molding resin 3 fills a space between external appearance surface film 20 and electronic function imparting film 30. As the injection molding resin, normally, a thermoplastic resin having excellent moldability and molding strength is used. When filling a molding mold with the thermoplastic resin, it is necessary to fill the molding mold with a resin that is heated to a molten state at a high pressure. By being exposed to the heat of injection molding resin 3 in the molten state, thermal deterioration occurs in electronic component 14 mounted on the electronic function imparting film. Injection molding resin 3 in the molten state contacts with the electronic component, and the filling pressure added to the resin is applied to the electronic component, thereby damage such as package deformation of an electronic component may occur. An insert molded body having an electronic function manufactured in this way has a problem that an operational stability of the incorporated electronic component cannot be guaranteed.

As illustrated in FIG. 12, when electronic component 14 is a light emitting element such as an LED, by using transparent injection molding resin 3, the light emitted from electronic component 14 can pass through transparent injection molding resin 3 and pass through light transmitter 17d of pattern layer 9. At this time, in order to uniformly display the entire light transmitter 17d as a display mark through light transmitter 17d having a relatively large area, a side illumination type LED is usually used as a light emitting element. However, the light emitted from the side illumination type LED travels through transparent injection molding resin 3 to another light transmitter 18d in pattern layer 9, and there is a problem that the light leaks to a region that is not intended by the user on the external appearance surface. This problem is particularly serious when insert molded body 6 is used in a dark place because an unintended display by the user appears on the external appearance surface due to light leakage.

Therefore, the molded body for an electronic function of the present disclosure can avoid the influence of the heat or filling pressure of the molten resin during molding on the electronic components by molding with the first resin and the second resin. The molded body for an electronic function of the present disclosure can control the illumination region of light emitted from a light emitting element such as an incorporated LED. Hereinafter, steps S30 to S50 in the manufacturing process of the molded body for an electronic function using the first resin and the second resin will be described in detail with reference to FIGS. 13 to 15.

Step S30 of Filling Space With First Resin and Forming Intermediate Molded Body in Which External Appearance Surface Film and First Resin Are Integrated FIGS. 13A to 13C are views illustrating a molding step of intermediate molded body 28 in the manufacturing process of the molded body for an electronic function according to the exemplary embodiment of the present disclosure. As illustrated in FIG. 13A, first, external appearance surface film 20 obtained in the above-mentioned step S20 is installed in molding molds 4 and 5 by a supply robot (not illustrated). At this time, external appearance surface F side of external appearance surface film 20 is brought into contact with movable side mold 5. Fixed side mold 4 is provided with protrusions 52a, 53a, and 54a. Next, as illustrated in FIG. 13B, fixed side mold 4 and movable side mold 5 are closed, and first resin 35 is injected into the molding mold and fills a space between a surface of external appearance surface film 20 opposite to external appearance surface F and fixed side mold 4. Finally, after first resin 35 that is full in the space solidifies, the molding mold is opened, the completed insert molded body is picked up, and intermediate molded body 28 in which external appearance surface film 20 and first resin 35 are integrated is obtained. As illustrated in FIG. 13C, in intermediate molded body 28, cavities 52, 53, and 54 for accommodating electronic components are formed on the surface opposite to external appearance surface F at positions corresponding to protrusions 52a, 53a, and 54a on fixed side mold 4. The bottom portion of cavity 52 is filled with first resin 35. On the other hand, cavities 53 and 54 are not filled with first resin 35, that is, the surface of external appearance surface film 20 opposite to external appearance surface F is exposed in cavities 53b and 54b.

Desirably, a thermoplastic resin is used for first resin 35. The thermoplastic resin has excellent moldability and strength, can form a complicated shape, and can manufacture a molded body having sufficient strength. The thermoplastic resin has a high productivity because the solidification time is short.

Step S40 of Filling Space With Second Resin and Pasting Electronic Function Imparting Film to Intermediate Molded Body FIGS. 14A to 14B are views illustrating a step S40 of pasting electronic function imparting film in the manufacturing process of the molded body for an electronic function according to the exemplary embodiment of the present disclosure. As illustrated in FIG. 14A, intermediate molded body 28 is installed in jig for fixing 40, and cavities 52, 53, and 54 are filled with second molten resin 36. Second molten resin 36 can be supplied by, for example, dispenser 41.

Subsequently, as illustrated in FIG. 14B, electronic function imparting film 30 is pasted to intermediate molded body 28 such that electronic components 32, 33, and 34 are disposed in cavities 52, 53, and 54, respectively, so as to be surrounded by the second molten resin in cavities 52, 53, and 54. At this time, as illustrated in FIG. 14B, electronic function imparting film 30 may be pressed by using jig for pasting 44. Jig for pasting 44 has a shape such that the center is gently projection-shape on the surface that is in contact with electronic function imparting film 30. By pasting electronic function imparting film 30 to intermediate molded body 28 while pressing electronic function imparting film 30 using jig for pasting 44, it is possible to prevent voids from being generated in second molten resin 36. When surplus molten resin 42 overflows on the surface of intermediate molded body 28 at the time of pasting, the surplus molten resin may be removed so as not to affect the shape of the molded body product.

One Modification Example of Step S40

FIG. 15 illustrates one modification example of a step of pasting electronic function imparting film in the manufacturing process of the molded body for an electronic function according to the exemplary embodiment of the present disclosure. In the modification example of step S40, as illustrated in FIG. 15, intermediate molded body 28 is installed on jig for fixing 40, and electronic function imparting film 30 is pasted to intermediate molded body 28 such that electronic components 32, 33, and 34 are disposed in cavities 52, 53, and 54, respectively. At this time, in order to fix electronic function imparting film 30, reinforcing plate 45 may be in contact with and pressed against the upper surface of electronic function imparting film 30.

Subsequently, using dispenser 41, second molten resin 36 fills cavities 52, 53, and 54 so that accommodated electronic components 32, 33, and 34 are surrounded by the second molten resin. At this time, it is necessary to provide through holes for bleeding air in electronic function imparting film 30 and reinforcing plate 45. Cavities 52, 53, and 54 may be filled with second molten resin 36 one by one. In this case, the filling process takes longer than the above-described exemplary embodiment.

Second resin 36 used in the above-mentioned step S40 is desirably a curable resin and has a curing temperature lower than the molding temperature of the first resin. More desirably, the curing temperature of second resin 36 is 100° C. or lower. As a result, the thermal deterioration does not occur in the electronic components disposed so as to be surrounded by second molten resin 36. Further, second resin 36 may be a thermosetting resin, a UV curable resin, a radiation curable resin, or a two-component curable resin, and is desirably a polymethyl methacrylate resin (PMMA) or an epoxy resin. Since a high filling pressure is not required when filling spaces with these resins, damage such as package deformation of electronic components does not occur.

Finally, in step S50, the second molten resin solidifies and molded body 6 for an electronic function (FIG. 2) in which electronic function imparting film 30 and intermediate molded body 28 are integrated is completed.

In this way, in molded body 6 for an electronic function obtained through a two-stage molding process using two types of resins, the incorporated electronic components 32, 33, and 34 are surrounded and integrated by second resin 36 having a low curing temperature. Thereby, it is possible to solve the problem of damage such as thermal deterioration of the incorporated electronic component or package deformation due to high temperature and high pressure of the injection molding molten resin in the insert molding step in the related art.

Such a molded body for an electronic function obtained through a two-stage molding process using these two types of resins can control a function of the electronic component within a predetermined region by using two types of resins with different properties, depending on the performance of the incorporated electronic components. This will be described in detail with reference to FIG. 16 below.

Figure 16:
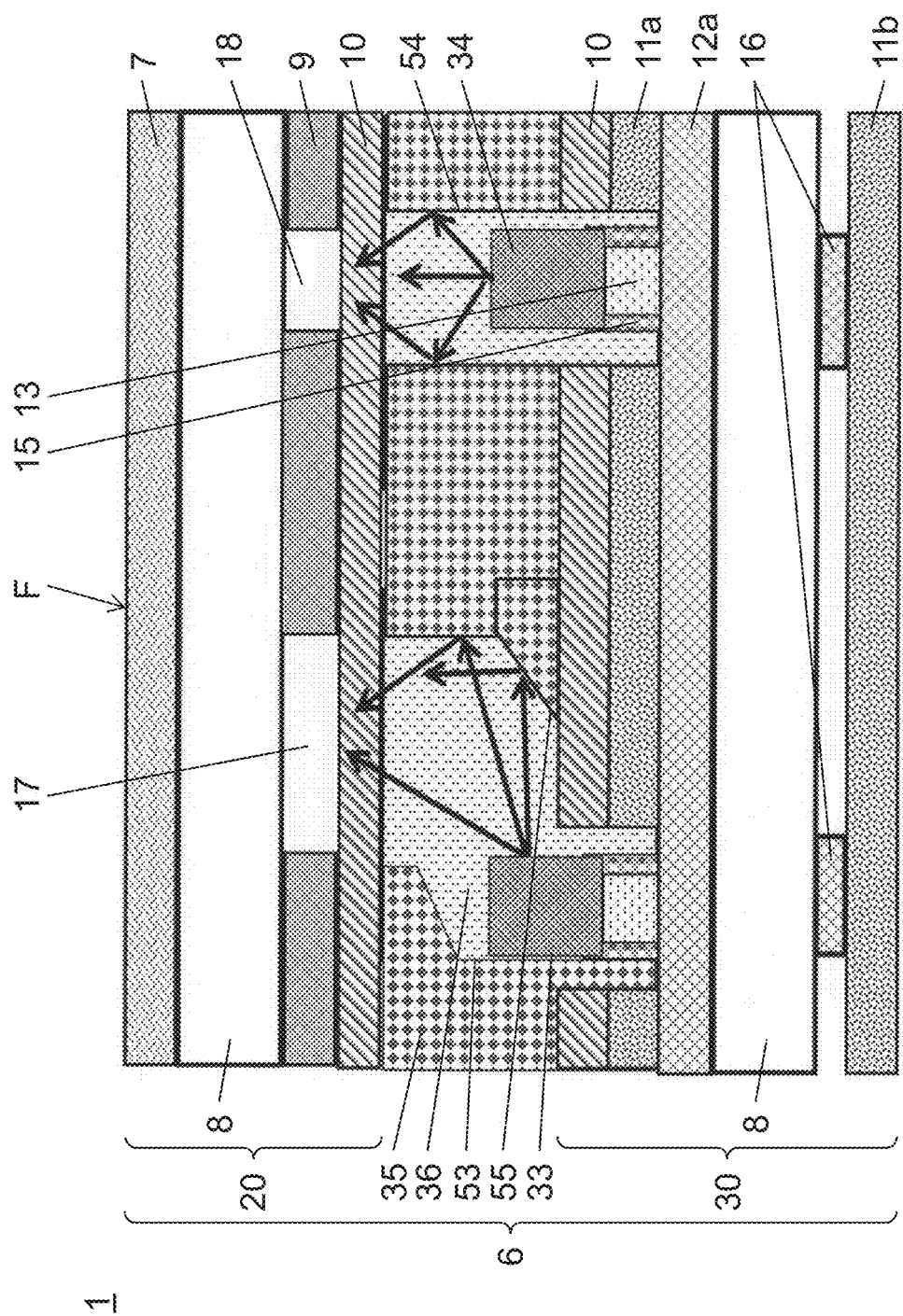
FIG. 16 is a view illustrating an operation device using the molded body for an electronic function according to the exemplary embodiment of the present disclosure, and is a cross-sectional view illustrating a configuration in which a light emitting element is incorporated.

FIG. 16 is a view illustrating operation device 1 using molded body 6 for an electronic function according to the exemplary embodiment of the present disclosure, and is a cross-sectional view illustrating a configuration in which light emitting elements 33 and 34 are incorporated.

External appearance surface film 20 of operation device 1 illustrated in FIG. 16 is constituted by surface function layer 7, base material film 8, pattern layer 9, and adhesive layer 10 from external appearance surface F side of the product. In the present exemplary embodiment, external appearance surface film 20 is provided with light transmitters 17 and 18 by patterning on pattern layer 9, and a transparent or translucent material that allows light to pass through is used for surface function layer 7, base material film 8, pattern layer 9, and adhesive layer 10. Pattern layer 9 is formed so that a portion other than the light transmitter does not transmit light.

Electronic function imparting film 30 of operation device 1 is configured such that from the side facing external appearance surface F, adhesive layer 10, resist layer 11a, conductive ink layer 12a, base material film 8, and electrostatic sensor portion 16 configured with the conductive ink, and resist layer 11b are disposed in this order. Light emitting elements 33 and 34 are mounted on conductive ink layer 12a via conductive adhesive 13 and underfill 15.

Display 2 is provided on external appearance surface F of operation device 1 (see FIG. 1). In display regions 2a and 2b of display 2, the shapes of light transmitters 17 and 18 are displayed as marks a and b indicating the operation instructions. In order to display the relatively large mark a with uniform light emission, light emitting element 33 may desirably use a side illumination type LED, and light emitting element 34 for displaying a relatively small mark b may use a top illumination type LED.

Since one type of transparent injection molding resin 3 is used in the insert molded body according to the related art illustrated in FIG. 12, the light emitted from the side illumination type LED passes through both light transmitters 17 and 18 of pattern layer 9, thereby there is a problem that the light leaks to a region that is not intended by the user on the external appearance surface. In contrast to this, in operation device 1 using the molded body for an electronic function according to the present disclosure, as illustrated in FIG. 16, the outside of cavities 53 and 54 that accommodate light emitting elements 33 and 34 is filled with first resin 35. Further, cavities 53 and 54 are provided from external appearance surface film 20 to electronic function imparting film 30. Inside cavities 53 and 54, light emitting elements 33 and 34 are accommodated so as to be surrounded by second resin 36.

In the present exemplary embodiment, first resin 35 has a higher reflectance than second resin 36 at the light emitting wavelength of side illumination type LED 33. Desirably, first resin 35 has a reflectance of 95% or more at the light emitting wavelength of side illumination type LED 33, and second resin 36 has a transmittance of 90% or more at the light emitting wavelength of side illumination type LED 33. As a result, the light emitted from side illumination type LED 33 is reflected by the inner wall of cavity 53 and passes through only light transmitter 17, and the shape of light transmitter 17 can be displayed as mark a only in display region 2a on the external appearance surface. Similarly, the light emitted from top illumination type LED 34 is reflected by the inner wall of cavity 54 and passes through only light transmitter 18, and the shape of light transmitter 18 can be displayed as mark b only in display region 2b on the external appearance surface. In this way, it is possible to solve the problem that the light leaks to a region that is not intended by a user on the external appearance surface.

As illustrated in FIG. 16, cavity 53 accommodating side illumination type LED 33 may have inclined portion 55 in which the inner wall formed of first resin 35 is inclined with respect to external appearance surface F. By providing inclined portion 55, among the light emitted from side illumination type LED 33, the light incident on inclined portion 55 is efficiently reflected by light transmitter 17, and mark a can be displayed in corresponding display region 2a.

Electrostatic sensor portion 16 can be manufactured, for example, by a conductive ink printing. When the user brings a conductive indicator such as a finger close to a certain display region on external appearance surface F of operation device 1, electrostatic sensor portion 16 can detect the operation instruction of the user by detecting a change in electrostatic capacitance between the conductive indicator of the user and the display region of external appearance surface F.

On the other hand, it may be necessary to conceal the electronic component incorporated in the molded body for an electronic function so that the electronic component is not visually recognized from the outside. In particular, for example, an electronic component having high security such as highly confidential operation programs and memories in which data and the like are stored need to be made inaccessible by a third party. However, in insert molded body 6d formed by using the technique in the related art illustrated in FIG. 12, it is necessary to use transparent injection molding resin 3 in order to illuminate the display with a light emitting element such as an incorporated LED. Regarding electronic component 14 incorporated in the molded body by transparent injection molding resin 3, for example, when a third party uses external lighting, the disposition position of electronic component 14 can be easily visually recognized from the outside of insert molded body 6d, thereby there is a problem that the incorporated electronic component is accessed by disassembling insert molded body 6d. That is, it is difficult for an insert molded body in the related art to have both a display function and a concealment function.

Therefore, the molded body for an electronic function obtained through a two-stage molding process using the two types of resins according to the present disclosure can have both a display function and a concealment function by controlling the display function within a predetermined region. This will be described in detail with reference to FIGS. 17 and 18.

Figure 17:
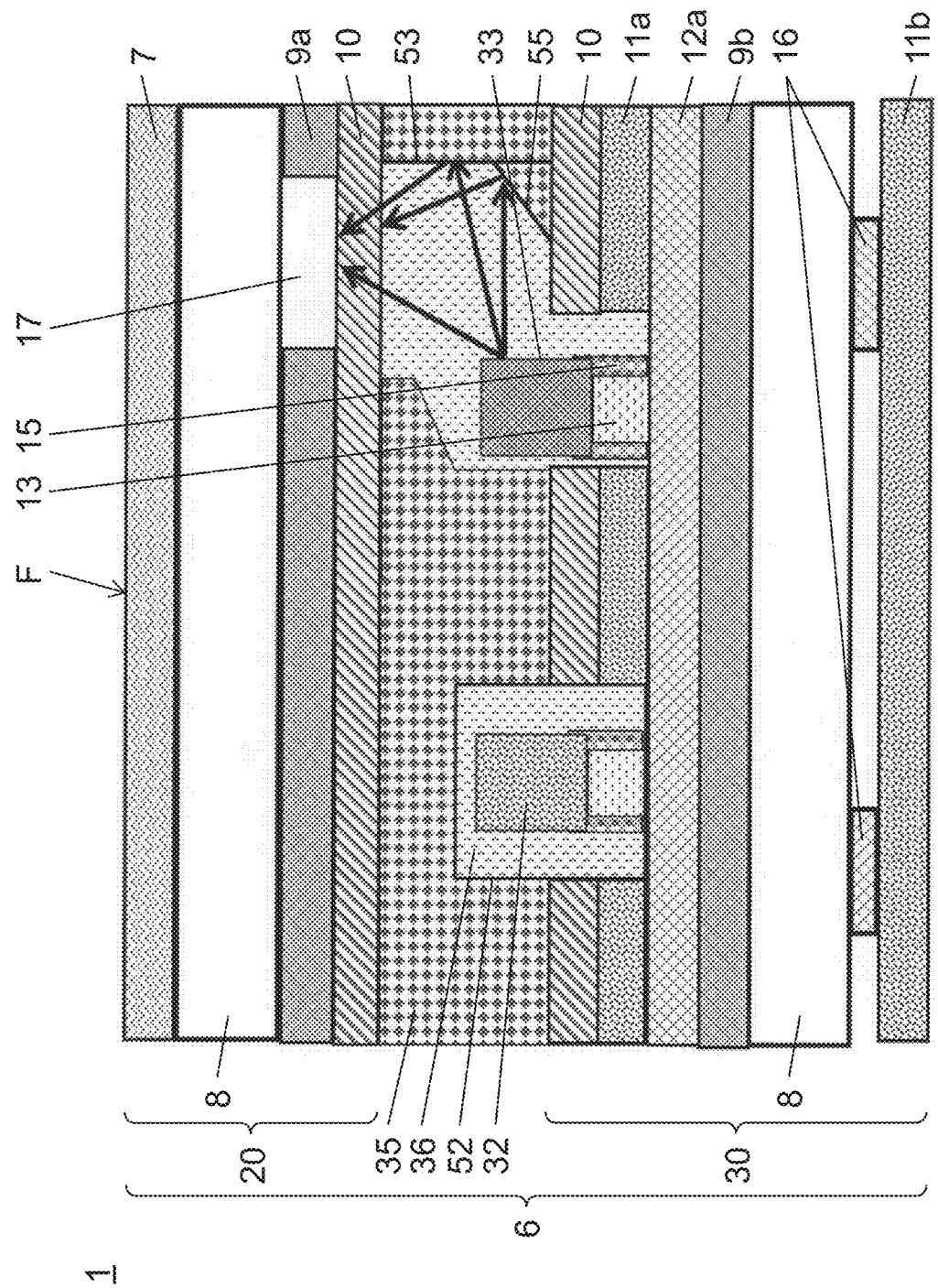
FIG. 17 is a view illustrating the operation device using the molded body for an electronic function according to the exemplary embodiment of the present disclosure, and is a cross-sectional view illustrating a configuration in which an electronic component that is not visually recognized from the outside is incorporated.

FIG. 17 is a view illustrating the operation device using the molded body for an electronic function according to the exemplary embodiment of the present disclosure, and is a cross-sectional view illustrating a cross-sectional configuration in which electronic component 32 that is not visually recognized from the outside is incorporated.

In operation device 1 illustrated in FIG. 17, electronic component 32 having high security is accommodated in cavity 52. Cavity 52 cannot be visually recognized from external appearance surface F of operation device 1 because first resin 35 having high reflectance fills the upper portion. Electronic function imparting film 30 is configured so as to conceal conductive ink layer 12a by further providing pattern layer 9b on the lower surface of conductive ink layer 12a. By doing so, the disposition position of electronic component 32 cannot be visually recognized from both surfaces of operation device 1 in the external appearance, and it is possible to prevent a third party from disassembling insert molded body 6 to access electronic component 32. Further, by including the metal particles in pattern layer 9b, it becomes difficult to acquire structural data by plane X-rays, so that reverse engineering can be prevented.

Figure 18:
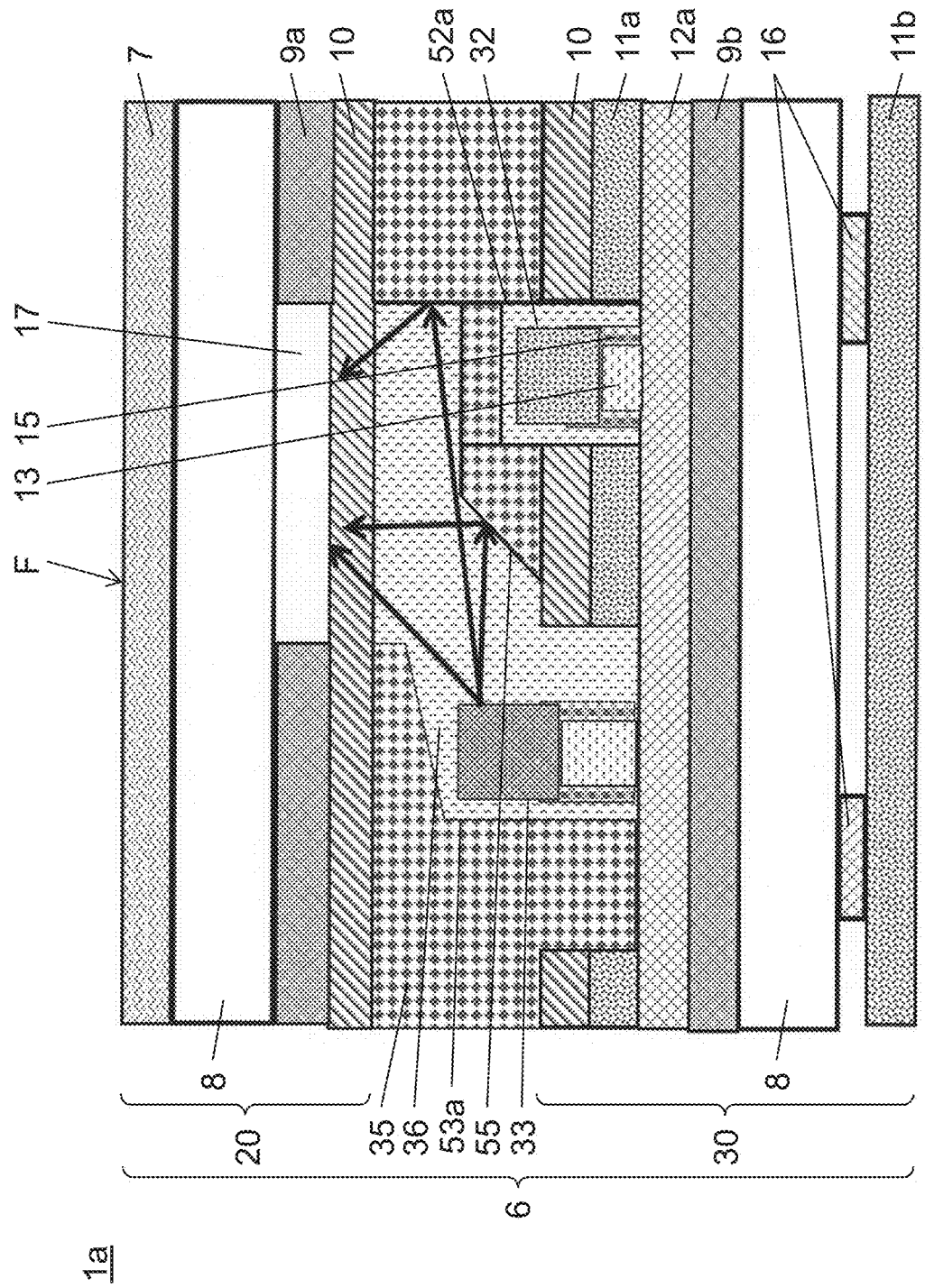
FIG. 18 is a view illustrating the operation device using the molded body for an electronic function according to the exemplary embodiment of the present disclosure, and is a cross-sectional view illustrating one modification example of a configuration in which an electronic component that is not visually recognized from the outside is incorporated.
Figure 19A:
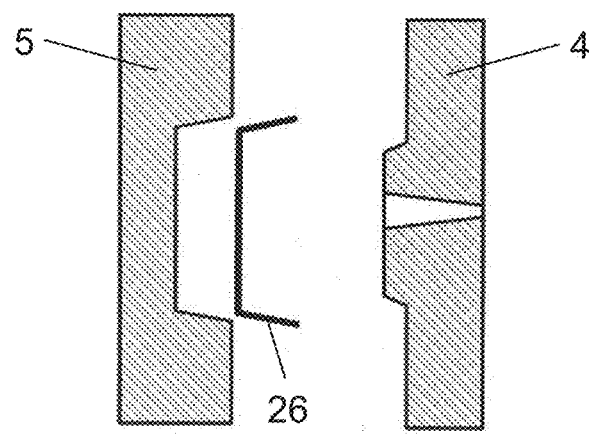
FIG. 19A is a view for explaining a general insert molding process, and is a cross-sectional view illustrating a step of installing an insert film in the molding mold.
Figure 19B:
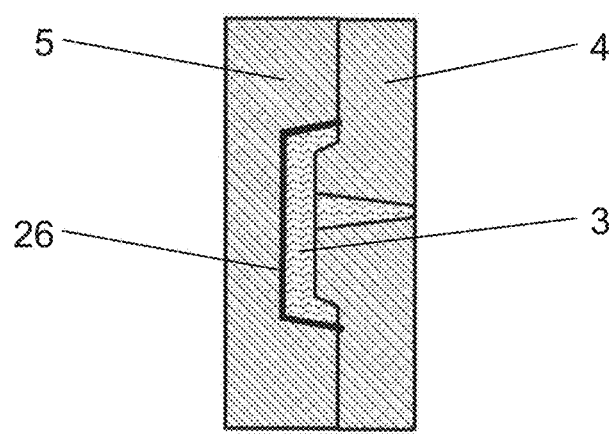
FIG. 19B is a view for explaining a general insert molding process, and is a cross-sectional view illustrating a step of clamping the molding mold and filling the molding mold with an injection molding resin.
Figure 19C:
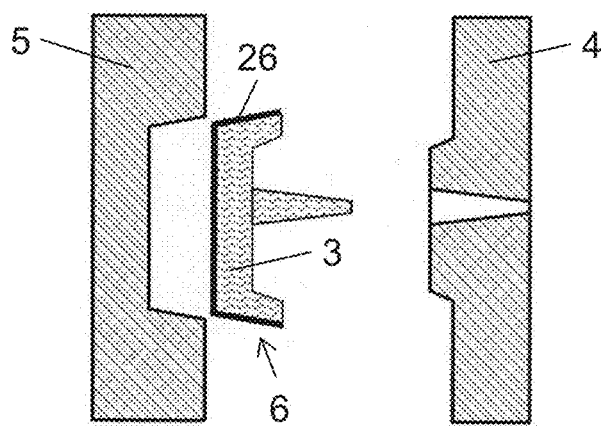
FIG. 19C is a view for explaining a general insert molding process, and is a cross-sectional view illustrating a step of picking up a completed insert molded body from the molding mold after the injection molding resin that is full in the molding mold solidifies.

One Modification Example of Operation Device in which Electronic Component That is not Visually Recognized From Outside is Incorporated In the top view illustrated in FIG. 1, region 2s in which electronic component 32 that is not visually recognized from external appearance surface F is incorporated is represented so as not to overlap with display regions 2a and 2b, but the present disclosure is not limited to this. FIG. 18 is one modification example of the operation device in which electronic component 32 that is not visually recognized from the outside is incorporated, and is a cross-sectional view illustrating a configuration in which electronic component 32 has a configuration such that the region where electronic component 32 is incorporated is disposed so as to at least partially overlap the display region.

In operation device 1a illustrated in FIG. 18, cavity 52a that accommodates electronic component 32 having high security is positioned below light transmitter 17 provided in pattern layer 9. Further, cavity 52a is at least partially overlapped with cavity 53a that accommodates side illumination type LED 33 via first resin 35 having a high reflectance in the upper portion, in a top view. In this case, the light emitted from side illumination type LED 33 is reflected by the inner wall of cavity 53 and passes through light transmitter 17, and mark a is displayed in display region 2a on the external appearance surface. On the other hand, electronic component 32 having high security cannot be visually recognized from external appearance surface F of operation device 1 due to first resin 35 which fills the upper portion of cavity 52a and has a high reflectance, thereby security can be ensured.

Cavities 53 and 53a having a complicated shape are formed in molded body 6 for an electronic function constituting the operation device illustrated in FIGS. 16 to 18. In order to form a cavity having such a complicated shape, a movable molding mold including a movable component (called a slide) can be used in the molding step of intermediate molded body 28 illustrated in FIG. 13. For example, by relatively moving movable side mold 5 provided with a movable component (not illustrated) to an X-Y plane perpendicular to the Z direction in addition to an opening and closing movement in the Z direction with respect to fixed side mold 4, a cavity having a complicated shape can be formed in intermediate molded body 28.

In this way, molded body for an electronic function obtained through a two-stage molding process using two types of resins can have a display function and also can conceal the incorporated electronic component so as not to be visually recognized from the outside of the molded body for an electronic function. Therefore, the higher functional integration can be achieved than the insert molded body in the related art.

In the exemplary embodiment of the present disclosure described above, the molded body for an electronic function has a configuration in which a plurality of incorporated electronic components are integrated so as to be surrounded by one type of second resin, but the present disclosure is not limited to this. For example, depending on the performance of each of the plurality of electronic components, a plurality of types of second resins can be used to form a molded body for an electronic function so as to surround each of the electronic components.

The present disclosure is not limited to the above exemplary embodiment and can be implemented in various other modes. For example, in the above description, as an application of the molded body for an electronic function, an operation device has been described as an example, but the present disclosure is not limited to this. For example, similar effects can be obtained when used in an electronic terminal, a printed board, an electronic payment device, or various integrated type electronic devices.

By appropriately combining any modification examples or configuration examples among the various modification examples or configuration examples described above, it is possible to configure different exemplary embodiments in which the effects of each can be achieved. Further, it is possible to combine the modification examples or configuration examples, and it is also possible to combine different exemplary embodiments configured with various combinations or features in different exemplary embodiments.

The present disclosure has been fully described in connection with the desired exemplary embodiments with reference to the accompanying drawings, and various modifications and changes will be apparent to those skilled in the art. It is to be understood that such modifications and changes are included within the scope of the disclosure as long as they do not depart from the scope of the disclosure as defined by the appended claims.

According to the molded body for an electronic function of the present disclosure, it is possible to avoid damage such as thermal deterioration or package deformation of an electronic component due to an insert molding process in the related art and to control an illumination region of a light emitting element incorporated in the molded body. Further, for the molded body for an electronic function of the present disclosure, the higher functional integration can be achieved than the insert molded body in the related art.

What is claimed is:

1. A molded body for an electronic function comprising:
    a first film including a first surface serving as an external appearance surface;
    a second film including a surface on which an electronic component is mounted, the surface facing a second surface of the first film opposite to the external appearance surface; and
    a first resin layer composed of a first resin filled between the first film and the second film so as to be in contact with the second surface of the first film and the surface of the second film,
    wherein the first resin layer has a first cavity and a second cavity formed in the first resin layer,
    the first cavity is composed of an upper surface on which the first film is exposed, a lower surface on which the second film is exposed, and a side surface made of the first resin,
    the second cavity is composed of a lower surface on which the second film is exposed, an upper surface made of the first resin, and a side surface made of the first resin,
    a light emitting element is mounted on the second film and is accommodated in the first cavity,
    the electronic component mounted on the second film is accommodated in the second cavity,
    the first cavity and the second cavity are filled with a second resin, and the light emitting element and the electronic component are surrounded by the second resin.

2. The molded body for an electronic function of claim 1, wherein the first cavity extends from the first film to the second film, and light emitted from the light emitting element passes through the second resin, and is incident on a predetermined region on the second surface of the first film.

3. The molded body for an electronic function of claim 2, wherein the second resin surrounding the light emitting element has a higher transmittance than a transmittance of the first resin at a light emitting wavelength of the light emitting element, and the first resin has a higher reflectance than a reflectance of the second resin at the light emitting wavelength of the light emitting element.

4. The molded body for an electronic function of claim 2, wherein the first resin has a reflectance of 95% or more at a light emitting wavelength of the light emitting element.

5. The molded body for an electronic function of claim 2, wherein the second resin has a transmittance of 90% or more at a light emitting wavelength of the light emitting element.

6. The molded body for an electronic function of claim 2, wherein the first cavity has an inclined portion in which an inner wall formed of the first resin is inclined with respect to the external appearance surface, and in the light emitted from the light emitting element, light incident on the inclined portion is reflected to the predetermined region.

7. The molded body for an electronic function of claim 1, wherein the first resin is a thermoplastic resin.

8. The molded body for an electronic function of claim 1, wherein the second resin is a curable resin and has a curing temperature lower than a molding temperature of the first resin.

9. The molded body for an electronic function of claim 8, wherein the second resin has a curing temperature of 100° C. or lower.

10. The molded body for an electronic function of claim 9, wherein the second resin is one type of a thermosetting resin, a UV curable resin, a radiation curable resin, and a two-component curable resin.

11. The molded body for an electronic function of claim 1, wherein the electronic component is mounted on the second film via a conductive ink.

12. An operation device comprising:
the molded body for an electronic function of claim 2, wherein the first film includes
a light transmitter having a predetermined shape representing an operation instruction in the predetermined region,
a display indicating the operation instruction by displaying the predetermined shape when the light transmitter is irradiated with light on the external appearance surface,
the second film is provided with an electrostatic sensor, and
the electrostatic sensor detects the operation instruction by detecting a conductive indicator that approaches the display.

13. The operation device of claim 12, wherein the electronic component accommodated in the second cavity includes an electronic component that is not visually recognized from the external appearance surface of the first film.

14. The operation device of claim 12, wherein the light emitting element is a top illumination type LED or a side illumination type LED.

15. A method for manufacturing a molded body for an electronic function comprising:
preparing a first film in which one surface thereof constitutes an external appearance surface;
preparing a second film in which an electronic component is mounted on one surface thereof;
forming an intermediate molded body in which the first film and a first molten resin are integrated by
installing, in a mold comprising a movable side mold and a fixed side mold having a plurality of protrusions on a surface facing the movable side mold, the first film by bringing the one surface constituting the external appearance surface into contact with the movable side mold,
injecting, after closing the fixed side mold and the movable side mold, the first molten resin between the fixed side mold and a surface of the first film opposite to the external appearance surface, and
solidifying the first molten resin such that a plurality of cavities are formed at positions corresponding to the plurality of protrusions, respectively, in the first molten resin which is bonded to the surface of the first film opposite to the external appearance surface;
pasting the second film to the intermediate molded body such that the electronic component is disposed in a first cavity of the plurality of cavities and filling the first cavity with a second molten resin such that the electronic component is surrounded by the second molten resin in the first cavity; and
forming a molded body, in which the second film on which the electronic component is mounted and the intermediate molded body are integrated, by solidifying the second molten resin.

16. The method for manufacturing a molded body for an electronic function of claim 15, wherein the filling of the first cavity with the second molten resin is performed after the second film is pasted to the intermediate molded body such that the electronic component is disposed in the first cavity.

17. The method for manufacturing a molded body for an electronic function of claim 15, wherein the pasting of the second film to the intermediate molded body such that the electronic component is disposed in the first cavity is performed after the filling of the first cavity with the second molten resin.

* * * * *